US005815249A

United States Patent [19]
Nishi et al.

[11] Patent Number: 5,815,249
[45] Date of Patent: Sep. 29, 1998

[54] ILLUMINATION OPTICAL APPARATUS AND METHOD HAVING A WAVEFRONT SPLITTER AND AN OPTICAL INTEGRATOR

[75] Inventors: Kenji Nishi, Yokohama; Naomasa Shiraishi, Kawasaki, both of Japan

[73] Assignee: Nikon Corporation, Tokyo, Japan

[21] Appl. No.: 940,288

[22] Filed: Sep. 30, 1997

Related U.S. Application Data

[60] Continuation of Ser. No. 638,284, Apr. 26, 1996, abandoned, which is a division of Ser. No. 231,159, Apr. 22, 1994, abandoned.

[30] Foreign Application Priority Data

Apr. 22, 1993 [JP] Japan .................................. 5-095930
Jun. 11, 1993 [JP] Japan .................................. 5-140579
Jun. 16, 1993 [JP] Japan .................................. 5-144634

[51] Int. Cl.⁶ .................................................. G03B 27/72
[52] U.S. Cl. .............................. 355/71; 355/67; 359/619
[58] Field of Search .................................. 355/53, 67, 69, 355/70, 68, 71; 359/619

[56] References Cited

U.S. PATENT DOCUMENTS

| | | | |
|---|---|---|---|
| 4,918,583 | 4/1990 | Kudo et al. | 362/268 |
| 5,016,149 | 5/1991 | Tanaka et al. | 362/259 |
| 5,335,044 | 8/1994 | Shiraishi | 355/53 |
| 5,420,417 | 5/1995 | Shiraishi | 250/205 |

FOREIGN PATENT DOCUMENTS 5-45605  2/1993  Japan .

Primary Examiner—David C. Nelms
Assistant Examiner—Andrew Q. Tran
Attorney, Agent, or Firm—Shapiro and Shapiro

[57] ABSTRACT

A diffraction grating is set between a light source and a fly-eye lens composed of a plurality of lens elements rectangular in cross section, and using the zeroth order diffraction beam and ±first order diffraction beams emergent from the diffraction grating, a plurality of light source images are formed along the longitudinal direction on the exit plane of each lens element in the fly-eye lens. In a preferred mode the intensity of illumination light on a mask is increased using first and second light sources, and a first illumination beam, which is obtained by combining a beam emitted from the first light source and passing through a half prism with a beam emitted from the second light source and reflected by the half prism on a same axis, and a second illumination beam, which is obtained by combining a beam emitted from the first light source and reflected by the half prism with a beam emitted from the second light source and passing through the half prism on a same axis, are made incident into the fly-eye lens as being inclined symmetrically with each other with respect to the optical axis of illumination optical system.

28 Claims, 12 Drawing Sheets

ILLUMINATION OPTICAL APPARATUS AND METHOD HAVING A WAVEFRONT SPLITTER AND AN OPTICAL INTEGRATOR This is a continuation of application Ser. No. 08/638,284 filed Apr. 26, 1996, which is a division of application Ser. No. 08/231,159 filed Apr. 22, 1994, both now abandoned.

BACKGROUND OF THE INVENTION

1. Field of the Invention

The present invention relates to an illumination optical apparatus and method suitably applicable to exposure apparatus used in the photolithography process for fabricating for example semiconductor devices, liquid crystal display devices or thin-film magnetic heads.

2. Related Background Art

The photolithography process for fabricating for example the semiconductor devices employs a projection exposure apparatus having an illumination optical system for irradiating illumination light from a light source onto a photomask or a reticle (which will be collectively referred to as a reticle) and a projection optical system for projecting an image of a pattern on the reticle onto a substrate (semiconductor wafer, glass plate, etc.) coated with a photosensitive material (photoresist). A recent trend is to use reduction projection exposure apparatus of the step-and-repeat method, i.e., so-called steppers, as disclosed for example in U.S. Pat. No. 4,699,515.

In order to enhance illuminance uniformity on the reticle, the projection exposure apparatus uses a fly-eye type optical integrator (fly-eye lens) for example as disclosed in U.S. Pat. No. 4,619,508 or U.S. Pat. No. 4,668,077. The exit plane of fly-eye lens is a Fourier transform plane for the pattern surface of reticle in the illumination optical system. A surface illuminant image (an aggregation of point sources corresponding to associated lens elements constituting the fly-eye lens) is formed at this plane.

Further, U.S. Pat. No. 4,497,013 or U.S. Pat. No. 4,497,015 discloses such an arrangement that two fly-eye lenses are aligned along the optical axis of illumination optical system to greatly increase the number of point sources whereby the illuminance uniformity is improved on the reticle. Also, U.S. Pat. No. 4,918,583 discloses an arrangement using a rod-type optical integrator together with the fly-eye lens to improve the illuminance uniformity, and U.S. Pat. No. 5,153,773 discloses an arrangement in which a plurality of beams are made obliquely incident into the fly-eye lens to increase the number of point sources whereby the illuminance uniformity is improved. If a high-power laser such as an excimer laser is used and when a laser beam therefrom is focused on the exit plane of fly-eye lens to form point sources there, each lens element could be damaged thereby. Thus, U.S. Pat. No. 4,939,630 suggests such an arrangement that the point sources are formed at positions apart from the exit plane of fly-eye lens.

Incidentally, the entrance plane of fly-eye lens is conjugate with the pattern-formed surface of reticle. Because of this, a light quantity loss of illumination light becomes minimum when the entrance plane of each lens element is similar to an effective pattern area of reticle (a maximum area of pattern to be projected onto the substrate). Actually, the effective pattern area of reticle is often rectangular, because chip patterns of LSI or the like are rectangular. Therefore, the shape of the entrance plane of each lens element in the fly-eye lens is rectangular (of course, the shape of the exit plane is also rectangular).

An image field of the projection optical system used in steppers is rectangular but considerably close to square, i.e., rectangular with the vertical or longitudinal length being not so different from the horizontal or transversal length. Accordingly, the shape of the entrance plane of each lens element in the fly-eye lens is also rectangular but close to square. On the other hand, there are steppers with a fly-eye lens having square lens elements in cross section, because the effective pattern area itself of the reticle is square.

Accordingly, the conventional fly-eye lenses for steppers are formed such that lens elements each with square or almost-square-rectangular cross section are arranged vertically and horizontally. Light source images are formed on or near the exit plane of respective lens elements, so that the light source images are formed as an aggregation arranged in a grid pattern at same or slightly different longitudinal and transversal pitches.

Since the degree of integration for semiconductor devices is becoming increasingly higher these days, it is required to further enhance the resolution (i.e., revolving power) of a pattern projected onto the substrate. To meet the requirement, the numerical aperture of the projection optical system could be increased to improve the resolution, but it is not practical because the depth of focus becomes too shallow. Then there is a proposition of the modified light source method in which the shape of secondary light sources (or tertiary light sources, etc.) is modified in various ways in the illumination optical system to improve the resolution or the depth of focus of the projection optical system. In the modified light source method one of apertures of various shapes is set on the exit plane of fly-eye lens, that is, on the plane in a relation of Fourier transform with the reticle pattern. Further, the annular illumination method employs an aperture for making the shape of secondary (or tertiary) light sources annular.

As for the steppers, the longitudinal pitch is not so different from the transversal pitch for point light sources (secondary or tertiary light sources) formed on or near the exit plane of fly-eye lens. There are, however, recent propositions of a scanning projection exposure apparatus with an aspect (length-to-width) ratio of the effective pattern region on the reticle being greatly offset from 1:1, as disclosed in U.S. Pat. No. 4,747,678, U.S. Pat. No. 4,924,257 or U.S. Pat. No. 5,194,893. A stepper can be so arranged that the effective pattern area is 100 mm square on a reticle, that is, a good-image range in the image field of the projection optical system (with projection magnification of 1) is 141 ($=2^{1/2} \times 100$) mm in diameter ($\phi$). In contrast, in case a scanning projection exposure apparatus has the same good-image range of the projection optical system, i.e., $\phi=141$ mm, an illumination area on the reticle has the width in the scanning direction of 44.7 mm and the width in the non-scanning direction perpendicular to the scanning direction, of 134.2 mm. That is, the aspect ratio of the illumination area is approximately 1:3. Accordingly, an area of chip pattern transferable onto the substrate by one scanning exposure is 134.2 mm×(maximum movement stroke in the scanning direction) on the reticle. This permits the scanning projection exposure apparatus to form a considerably large chip pattern as compared with the steppers.

However, the scanning projection exposure apparatus must be so arranged, in order to decrease a loss in illumination light quantity, that the cross section of each lens element in the fly-eye lens is rectangular with an aspect ratio of 1:3, matching with the shape of the illumination area on the reticle. The lens elements of such cross section cause no problems in respect of machining or in respect of light quantity. However, point light sources formed on the exit plane of fly-eye lens have a longitudinal pitch three times larger than the transversal pitch. Such a large difference between the longitudinal (scanning direction) pitch and the transversal (non-scanning direction) pitch of point sources could cause a problem that imaging properties (exposure amount, resolution, depth of focus, etc.) in the scanning direction for an image of reticle pattern are different from those in the non-scanning direction. Further, if the annular illumination method or the modified light source method is employed, the above problem becomes more pronounced because an aperture stop shields illumination light from specific lens elements in the fly-eye lens so as to decrease the number of point sources.

Even if the annular illumination method or the modified light source method is applied to the projection exposure apparatus in which the effective pattern area on the reticle is rectangular with the aspect ratio of approximately 1:1, such as the steppers, there could occur such a problem that the imaging properties are different from each other for example between two orthogonal directions. The present applicant has proposed a method of improvement in U.S. application Ser. No. 020,775 (filed Feb. 22, 1993 corresponding to U.S. Pat. No. 5,335,044 issued Aug. 2, 1997). This method of improvement is, however, effective up to about 1:1.5 of the aspect ratio of effective pattern area, but cannot be so effective when the aspect ratio exceeds for example about 1:2.

In case a laser beam is used as the illumination light, light source images formed on the exit plane of lens elements in the fly-eye lens are almost point sources, which necessitates no consideration on a light quantity loss. In contrast, if, for example, the g line or i line from a super-high pressure mercury lamp is used as the illumination light, the light source images become a kind of surface illuminant. Then, with use of a fly-eye lens including a bundle of lens elements rectangular in cross section with the illumination light from the mercury lamp, such a problem could occur that the illumination light is eclipsed in the transverse direction of each lens element whereby a sufficient quantity of light cannot be attained.

Hence, in case of the fly-eye lens including a bundle of lens elements rectangular in cross section being used, a plurality of light sources are arranged along the longitudinal direction of lens elements and beams from the light sources are guided into the fly-eye lens in mutually different directions, for example as disclosed in Japanese Laid-open Patent Application No. 5-45605. Then there are a plurality of images corresponding to the light sources formed along the longitudinal direction on the exit plane of a lens element in the fly-eye lens, improving the illuminance uniformity and the illumination power (illuminance) on the reticle.

The arrangement as disclosed in the above Japanese application, however, has such a problem that if the plurality of light sources have different illumination powers illuminance unevenness occurs on the exit plane of fly-eye lens so as to lower the illuminance uniformity on the reticle. Also, in case one out of the plurality of light sources is off (e.g., burned out), the illuminance unevenness on the reticle would become out of a permissible range. Further, the apparatus must be stopped during exchange of the light source, which causes a problem of a great decrease in throughput.

Further, a recent report showed an improvement in depth of focus or in resolution by optimizing the σ value (a value of reticle-side numerical aperture of illumination optical system/reticle-side numerical aperture of projection optical system) of illumination optical system in accordance with a reticle pattern. It becomes thus important to set the σ value of illumination optical system accurately to its optimum value. The σ value of illumination optical system is determined according to the diameter of illuminance distribution of light source images on the exit plane of fly-eye lens (which is a plane conjugate with the pupil plane of projection optical system). Because of a nonuniform illuminance distribution of light source images, such a problem would occur that the substantial σ value determined from the illuminance distribution (effective σ value) is different from the design σ value (nominal σ value).

SUMMARY OF THE INVENTION

It is a first object of the present invention to provide an illumination optical apparatus and method which can have improved illuminance uniformity on the reticle and which can set the imaging performance in the longitudinal direction of illumination area as close to that in the transversal direction thereof even if the illumination area on the reticle has an aspect ratio greatly deviating from 1:1. It is a second object of the present invention to provide an illumination optical apparatus and method which can obtain excellent illuminance uniformity even with use of a plurality of light sources.

An illumination optical apparatus for achieving the first object of the present invention has a light source for producing illumination light, a light source image forming member for forming a plurality of light source images with illumination light incident thereon, a condenser lens system for condensing beams from the plurality of light source images to illuminate a mask, and a wavefront splitting member disposed between the light source and the light source image forming member, for splitting a wavefront of the illumination light from the light source into a plurality of wavefronts.

In the apparatus for achieving the first object of the present invention, the wavefront splitting member is set in the vicinity of the entrance plane of the light source image forming member, for example a fly-eye type optical integrator (fly-eye lens), whereby a beam to be incident into the fly-eye lens is split into a plurality of beams traveling in mutually different directions. By this, the plurality of beams are incident at mutually different incident angles on the fly-eye lens. Since the exit plane of fly-eye lens is nearly in a relation of Fourier transform with the entrance plane thereof, a plurality of light source images are formed by each lens element on or near the exit plane of fly-eye lens. If an aspect ratio of illumination area on a mask is for example 1:n (where n is an integer of not less than 2), an aspect ratio of the lens element is also set approximately to 1:n. In this case, the wavefront of a beam to be incident into the fly-eye lens is split into n wavefronts in the transversal direction, using the wavefront splitting member. This can set the longitudinal pitch as nearly equal to the transversal pitch as to the light source images formed on the exit plane of fly-eye lens. Accordingly, the imaging performance can be kept almost identical between a pattern having longitudinal periodicity and a pattern having transversal periodicity on the mask.

A first illumination optical apparatus for achieving the second object of the present invention has a fly-eye type optical integrator composed of a plurality of optical elements rectangular in cross section, for forming a plurality of light source images, a condenser lens system for condensing beams from the plurality of light source images to supply the beams to a mask, a beam splitting member for splitting a beam incident thereon in a first direction into a plurality of beams traveling in respective directions having different components along the longitudinal direction of the optical elements to supply the beams to the fly-eye type optical integrator and for splitting a beam incident thereon in a second direction different from the first direction into a plurality of beams traveling in the respective directions to supply the beams to the fly-eye type optical integrator, a first light source for supplying illumination light to the beam splitting member in the first direction, and a second light source for supplying illumination light to the beam splitting member in the second direction.

Also, a second illumination optical system for achieving the second object of the present invention has a fly-eye type optical integrator composed of a plurality of optical elements rectangular in cross section, for forming a plurality of light source images, a condenser lens system for condensing beams from the plurality of light source images to supply the beams to a mask, a first light source and a second light source disposed at mutually different positions, and a beam splitting member for splitting illumination light from the first light source into a plurality of beams traveling in respective directions having different components along the longitudinal direction of the optical elements to supply the beams to the fly-eye type optical integrator and for splitting illumination light from the second light source into a plurality of beams traveling in the respective directions to supply the beams to the fly-eye type optical integrator.

In the first illumination optical apparatus as described above, the beam splitting member splits the illumination light from the first light source for example into a first beam and a second beam, which are supplied to the fly-eye type optical integrator (fly-eye lens). Also, the illumination light from the second light source is split by the beam splitting member for example into a first beam and a second beam, which are supplied to the fly-eye lens. In this case, the illumination light incident on the fly-eye lens in the first direction is a combination of a first beam arising from the first light source and then split by the beam splitting member with a first beam arising from the second light source and then split by the beam splitting member. On the other hand, the illumination light incident on the fly-eye lens in the second direction is a combination of a second beam arising from the first light source and then split by the beam splitting member with a second beam arising from the second light source and then split by the beam splitting member.

Accordingly, there are two light source images formed corresponding to the illumination light beams incident in the first direction and in the second direction for each optical element in the fly-eye lens, as juxtaposed along the longitudinal direction thereof. This makes the density of light source images in the longitudinal direction on the exit plane of fly-eye lens nearly equal to that in the transversal direction. Also, light source images of each light source are independently formed on the exit plane of fly-eye lens, and two light source images corresponding to the first light source and two light source images corresponding to the second light source are superimposed on each other on the exit plane of one optical element. Thus, even if the illuminance of the first light source image is different from that of the second light source, the illuminance distributions of light source images can be kept uniform on the exit plane of fly-eye lens. Also, even if one of the first and second light sources should be off, no illuminance unevenness would occur because light source images of the other light source are formed in a same density distribution.

Since the first illumination optical apparatus is directed to a case in which the optical axis of the first light source intersects with the optical axis of the second light source, the structure of the optical system is relatively simple. Even if the optical axis of the first light source is parallel to the optical axis of the second light source, light source images may be superimposed over each other on the exit plane of fly-eye lens by such an arrangement that beams from the two light sources are supplied to the fly-eye lens in a same direction in a superimposed manner, enjoying the same operational effect as the first illumination optical apparatus. This is seen in the second illumination optical apparatus.

As described above, with the illumination optical apparatus for achieving the second object of the present invention, a plurality of beams each containing a beam from the first light source and a beam from the second light source are made incident on optical elements, at mutually different angles. Thus, a plurality of light source images formed on the exit plane of one optical element in the fly-eye lens each are a combination of illumination light from the first light source with illumination light from the second light source. Therefore, no illumination unevenness will occur even if there is a difference in light quantity (intensity) between the illumination light from the first light source and the illumination light from the second light source. In addition, even if either one of the light sources is off, the illuminance uniformity will not be degraded, (although the illuminance is reduced by aboutt half in such case. This means that during an exposure operation using one of the first and second light sources the other light source may be exchanged or adjusted. This permits continuous use of the illumination optical system, which improves the throughput. Particularly in case of laser light sources being used, the speckle pattern can be decreased because of the use of a combination of plural laser beams.

Further, in case the scanning exposure apparatus is used to perform pattern exposure using a high-sensitivity photoresist, scanning speeds for example of wafer and mask must be increased. There is, however, a mechanical limit to the scanning speeds of stages. Then the illuminance of illumination light must be lowered using for example an ND filter. Such a case is dealt with by simply deactivating one of the first and second light sources in the illumination optical apparatus of the present invention, avoiding waste of illumination power and extending the life of light sources.

Furthermore, since a plurality of light source images are formed by each optical element in the fly-eye lens along the longitudinal direction thereof, the substantial σ value of the illumination optical system is made almost coincident with the design σ value, obtaining a uniform illuminance distribution on the exit plane of fly-eye lens. Additionally, while an increase in luminance of light sources is ordinarily likely to increase the production cost of light sources, the first or second illumination optical apparatus of the present invention can use a plurality of low-luminance and cheap light sources to increase the illuminance, whereby the production cost thereof can be reduced.

It is also preferred that the illumination optical apparatus for achieving the second object of the present invention be arranged to have a first photoelectric detector for receiving part of illumination light from the first light source, a second photoelectric detector for receiving part of illumination light from the second light source, and an adjuster for adjusting the illuminance for at least one of the first and the second light sources in accordance with photoelectric signals from the first and second photoelectric detectors. This arrangement permits the intensity of illumination light from the first light source to be kept equal to that of illumination light from the second light source, further improving the illuminance uniformity on the mask.

DESCRIPTION OF THE PREFERRED EMBODIMENTS

Figure 1:
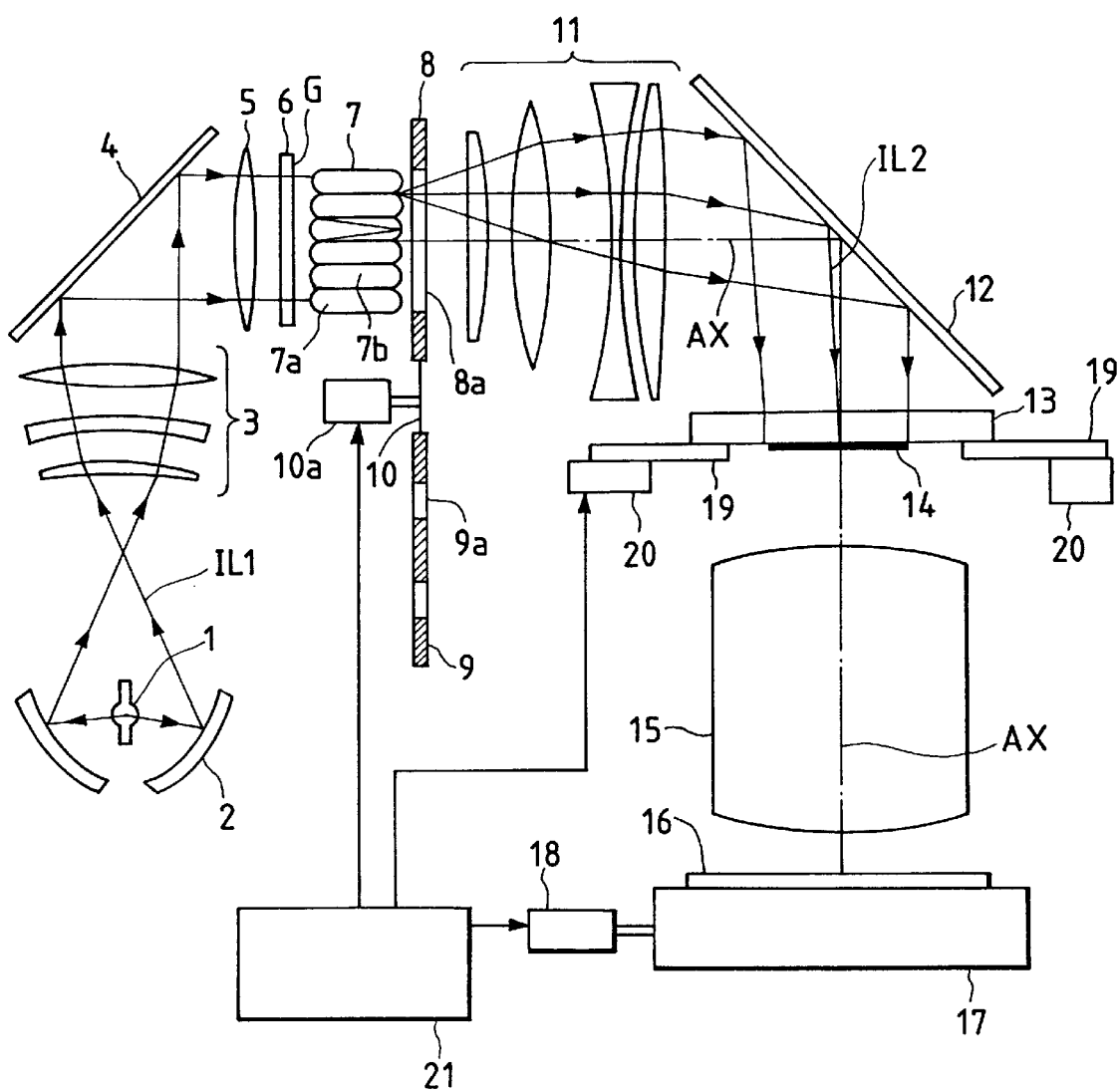
FIG. 1 is a drawing to show the structure of a projection exposure apparatus provided with an illumination optical system according to a first embodiment of the present invention.

The first embodiment of the present invention will be described referring to FIG. 1. FIG. 1 shows the scheme of a projection exposure apparatus provided with an illumination optical apparatus according to the present embodiment. In FIG. 1, illumination light IL1 emitted from a light source (for example a mercury lamp) 1 is reflected by an elliptic mirror 2 and then converged by an input lens system 3. After that, the illumination light advances via a bending mirror 4 and through an input lens 5 to become a beam of nearly parallel rays. Further, the illumination light IL1 is incident on an optically transparent substrate 6 in which a phase type, one-dimensional diffraction grating G is formed on the exit side, so that zeroth-order diffraction light and ±first-order diffraction light emerging from the diffraction grating of the optically transparent substrate 6 enters a fly-eye type optical integrator (hereinafter referred to as a fly-eye lens) 7.

The fly-eye lens 7 includes a bundle of double convex lens elements 7a, 7b, . . . each rectangular in cross section. The entrance plane of each of plural lens elements 7a, 7b, . . . is arranged nearly conjugate (in an imaging relation) with a pattern-formed surface of reticle 13. Also, an image (secondary light source) of the light source 1 is formed on the exit plane of each lens element 7a, 7b, . . . , and the exit plane of fly-eye lens 7 is kept in an optical relation of Fourier transform with the pattern-formed surface of reticle R.

An aperture stop (σ stop) 8 having a circular (or rectangular) aperture 8a is set in the vicinity of the exit plane of fly-eye lens 7. The aperture stop 8 is incorporated with and fixed on a holding member (for example, a turret plate, a slider, etc.) 10 together with an aperture stop for annular illumination 9 having an annular aperture 9a and an aperture stop for modified light source illumination (not shown). Rotating the holding member 10 by means of a driving system 10a, a desired aperture stop among the above aperture stops can be located in the illumination optical path.

Illumination light IL2 passing through the aperture stop 8 advances through a condenser lens group 11 and via a mirror 12 to illuminate a pattern 14 on the reticle 13 with nearly uniform illuminance. Light passing through the pattern 14 or light diffracted by the pattern 14 is condensed and focused by a projection optical system 15 to form an image of the pattern 14 on a wafer 16. The wafer 16 is held on a wafer stage 17. The wafer stage 17 is composed of an XY stage two-dimensionally movable in a plane perpendicular to the optical axis AX of the projection optical system 15 and a Z stage movable in the direction of the optical axis AX, through a motor 18.

In case the projection exposure apparatus of the present embodiment is used for the slit scan exposure method (scanning type), a reticle stage 19 for holding the reticle 13 is to be arranged as movable one-dimensionally on a reticle support table 20. Then upon scanning exposure the wafer stage 17 is moved into the plane of FIG. 1 in synchronization with movement of the reticle stage 19 on the reticle support table 20 out of the plane of FIG. 1, for example. The reticle is moved by means of a drive unit incorporated in the reticle support table 20. In this case a main control system 21 executes a control for synchronously moving the reticle stage 19 and the wafer stage 17. Further, the main control system 21 also controls a rotational angle of the holding member 10 through the driving system 10a to exchange the aperture stop 8 for another aperture stop, for example for the aperture stop for annular illumination or the aperture stop for modified light source illumination, and controls operations of the entire apparatus.

The operation of the present embodiment will be next described, assuming that the projection exposure apparatus of the present embodiment is of the slit scan exposure type. In this case, an illumination area (effective pattern area) on the reticle 13 illuminated by the illumination optical system is of a considerably slender rectangle (for example having an aspect ratio of about 3:1). Then, it is preferred that an aspect ratio of cross section of each lens element 7a, 7b, . . . in the fly-eye lens 7 is about 3:1.

Figure 3A:
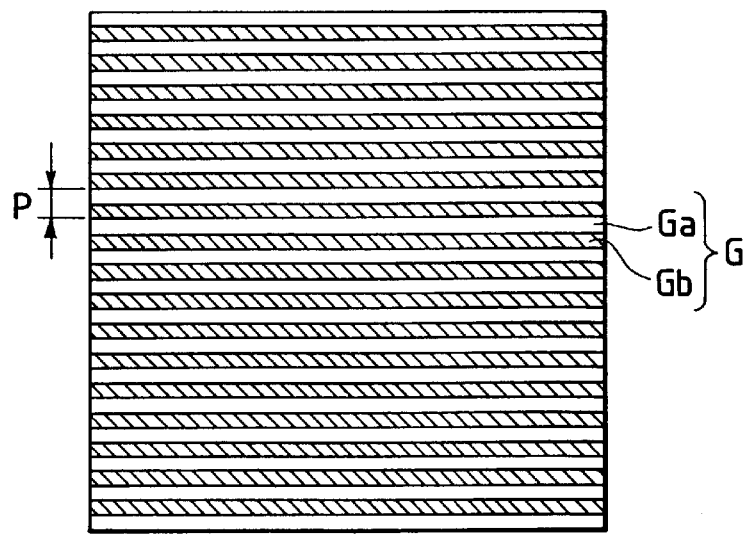
FIG. 3A is a drawing of the diffraction grating plate in FIG. 1 as seen from the fly-eye lens side.
Figure 3B:
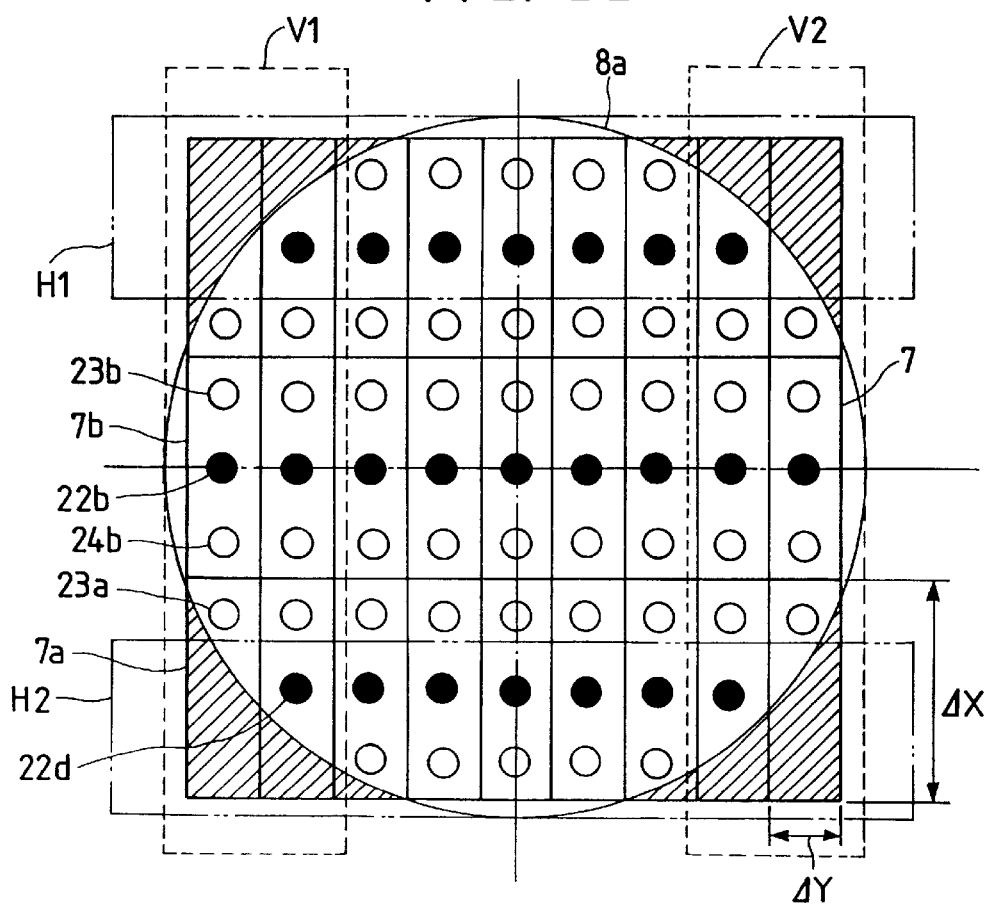
FIG. 3B is a drawing to show the fly-eye lens and an aperture stop in FIG. 1 as seen from the reticle side.

FIG. 3B is a drawing to show the exit plane of fly-eye lens 7 and the light source images (secondary light sources) formed by the lens elements in the present embodiment as seen from the reticle side, in which light source images 22b, 22d, . . . represented by black dots are those formed by the respective lens elements in the same manner as in the conventional apparatus. Let ΔX be the longitudinal width of the lens elements arranged in a grid array in the circular aperture 8a of aperture stop 8 and ΔY be the transversal width. Then, since the aspect ratio (i.e., ΔX:ΔY) is 3:1, the aspect ratio of array pitches of the light source images 22b, 22d, . . . represented by the black dots is also 3:1.

The present embodiment includes the optically transparent substrate 6 with the diffraction grating G formed therein as set before the fly-eye lens 7, as shown in FIG. 1. The function of the diffraction grating G is described below referring to FIG. 2.

Figure 2:
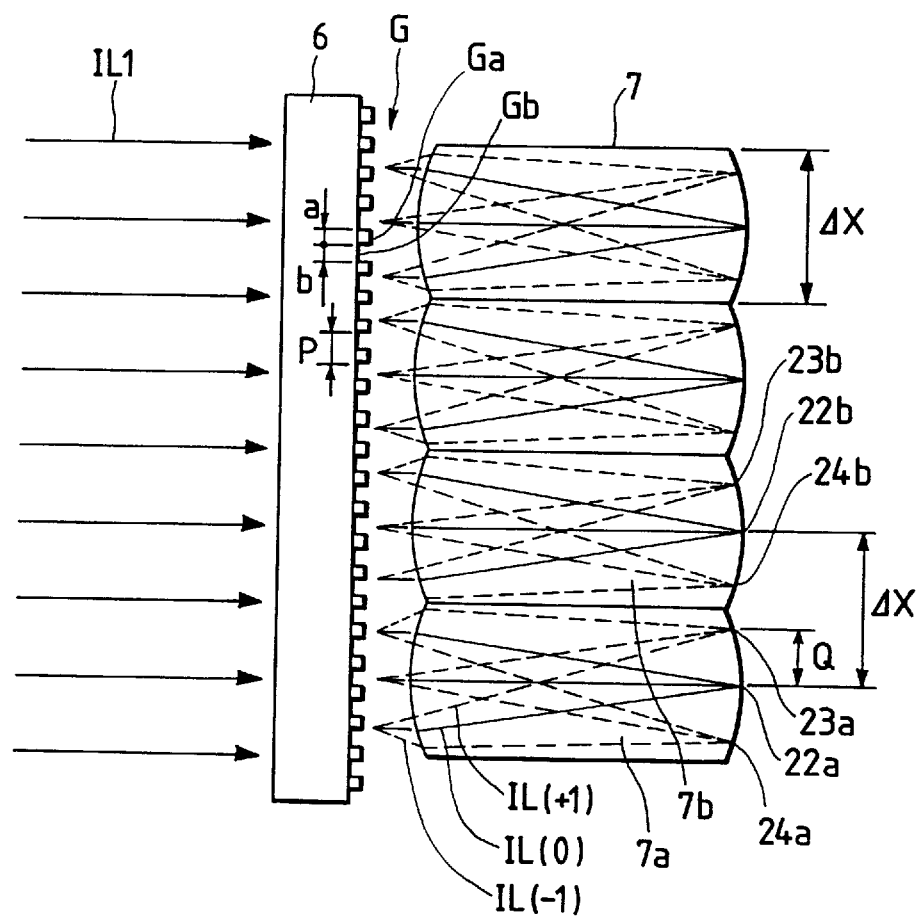
FIG. 2 is an enlarged drawing of a diffraction grating plate and a fly-eye lens in FIG. 1.

FIG. 2 is a side view of the fly-eye lens 7 and the optically transparent substrate 6. In FIG. 2, the phase diffraction grating G is formed on the exit plane of the optically transparent substrate 6 with projections Ga and recesses Gb arranged at pitch P in the direction parallel to the plane of FIG. 2. FIG. 3A is a drawing to show the diffraction grating G of FIG. 2 as seen from the fly-eye lens 7 side. The diffraction grating G is a one-dimensional phase grating in which the hatched projections Ga and the white recesses Gb are arranged in the vertical direction. Returning to FIG. 2, the illumination light IL1 as converted into a beam of nearly parallel rays enters the optically transparent substrate 6 to reach the diffraction grating G, and thereafter is split by the diffraction grating G for example into a zeroth order diffraction beam IL(0) and ±first order diffraction beams IL(+1) and IL(-1), i.e., into three diffraction beams in total. These three diffraction beams emerge at mutually different angles (diffraction angles) from the diffraction grating G and enter the fly-eye lens 7.

Among these three diffraction beams, the zeroth order diffraction beam IL(0) represented by a solid line forms a light source image 22*a*, 22*b*, ... on the center of the exit plane of each lens element 7*a*, 7*b*, ... similarly as in the conventional example with no diffraction grating G. The ±first order diffraction beam IL(+1) represented by a broken line forms a light source image 23*a*, 23*b*, ... on an upper portion of the exit plane of each lens element, while the −first order diffraction beam IL(−1) represented by a broken line forms a light source image 24*a*, 24*b*, ... on a lower portion of the exit plane of each lens element, thus forming three light source images per a lens element. Generalizing this, supposing n (n is an integer of not less than 2) diffraction beams emerging from the diffraction grating G are used, n light source images are formed on the exit plane of each lens element.

As described previously, FIG. 3B is a drawing to show the exit plane of fly-eye lens 7 and the light source images (secondary light sources) formed by the lens elements in the present embodiment as seen from the reticle side. As shown for a representative lens element 7*b* in FIG. 3B, a light source image 22*b* by the zeroth order diffraction beam represented by a black dot is formed approximately at the center of lens element 7*b* similarly as in the conventional example with no diffraction grating G. On the other hand, light source images 23*b*, 24*b* represented by blank circles, which are formed by the ±first order diffraction beams, respectively, are formed at positions vertically shifted from the center in accordance with the periodicity of diffraction grating G. It is of course apparent that the shifting direction of the light source image 23*b* by the +first order diffraction beam is opposite to that of the light source image 24*b* by the −first order diffraction beam.

Regarding the modified light source method, it has been found that the effect of the light source images differ depending upon the positions of light source images on the exit plane (secondary light source formed surface) of fly-eye lens 7. This is described for example in U.S. application Ser. No. 020,775 (filed Feb. 22, 1993 corresponding to U.S. Pat. No. 5,335,044 issued Aug. 2, 1997) and the theory thereof is described in Japanese Laid-open Patent Application No. 4-225358 (corresponding to Ser. No. 791,138 (filed Nov. 13, 1991 now abandoned)). Specifically, among the light source images (secondary light sources) in FIG. 3B, light source images within vertical regions V1 and V2 surrounded by dashed lines are effective to increase the resolution and the depth of focus for a pattern having vertical periodicity, while light source images within horizontal regions H1 and H2 surrounded by upper and lower chain double-dashed lines are effective to increase the resolution and the depth of focus for a pattern having horizontal periodicity.

Concerning this point, the conventional illumination optical system forms the light source images (secondary light sources) including only the images (22*b*, ... ) by the zeroth order diffraction beam as obtained in the present embodiment, so that the number of light source images within the vertical regions V1, V2 is different from that in the horizontal regions H1, H2. This will result in causing a difference in depth of focus or a difference in line width (difference in exposure amount) between a pattern having vertical periodicity and a pattern having horizontal periodicity on the reticle.

In contrast, the present embodiment is arranged to increase the number of secondary light sources in the longitudinal direction as formed in the circular aperture 8*a* in the aperture stop, as shown in FIG. 3B, by use of the optically transparent substrate 6 with the diffraction grating G formed thereon in the illumination optical system. This arrangement can minimize a difference (length-to-width difference) between the longitudinal pitch and the transversal pitch in the array of secondary light sources, permitting the secondary light sources to be formed with a more ideal distribution (almost uniform distribution). Further, the number of light source images in the vertical regions V1, V2 can be arranged as equal to or almost equal to the number of light source images in the horizontal regions H1, H2. This will result in no difference in line width or no difference in depth of focus between a pattern having vertical periodicity and a pattern having horizontal periodicity.

Below described are cases in which the aperture stop for annular illumination method or the annular stop for modified light source method is placed on the exit plane side of fly-eye lens 7 instead of the ordinary aperture stop 8.

Figure 4:
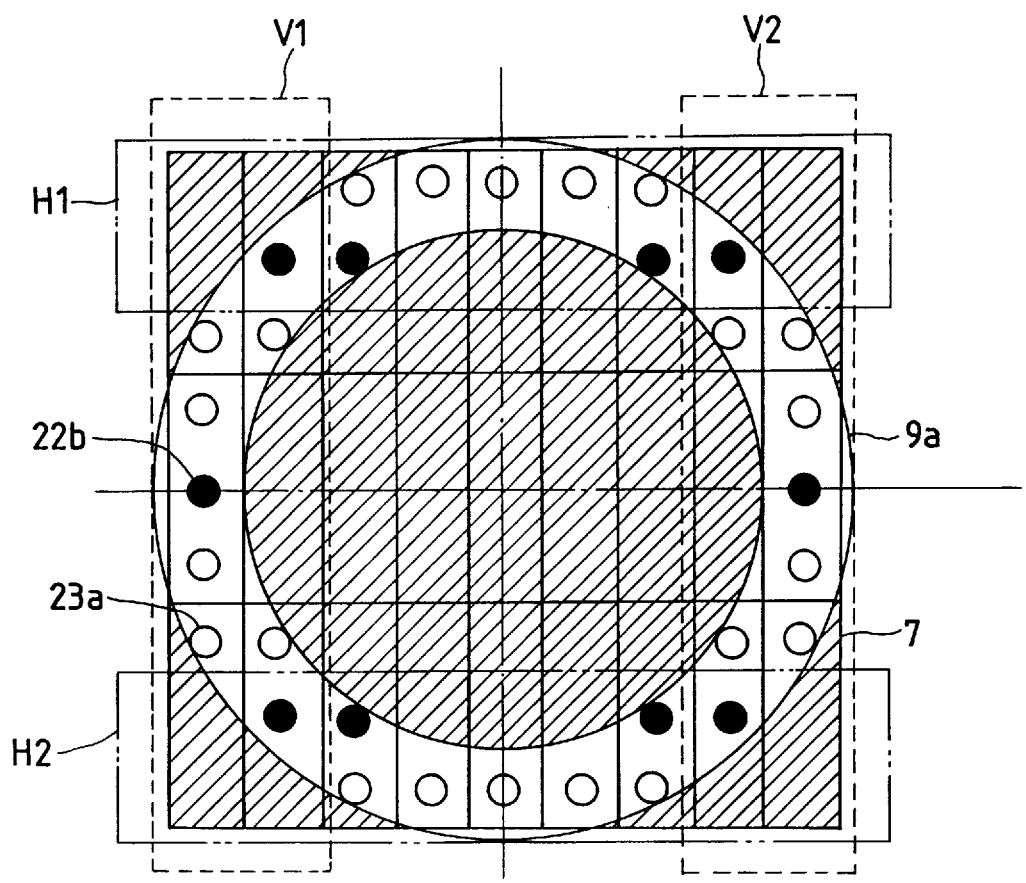
FIG. 4 is a drawing to show an arrangement in which an aperture stop for annular illumination method is located on the exit plane side of the fly-eye lens in FIG. 1.

FIG. 4 shows a case in which an aperture stop for annular illumination having an annular aperture 9*a* is set on the exit plane side of the fly-eye lens 7. In FIG. 4, without the diffraction grating G of FIG. 1, there are light source images (22*b*, ... ) formed only by the zeroth order diffraction beam as represented by solid dots in the annular aperture 9*a*. With only the light source images by the zeroth order diffraction beam the number of light source images in the vertical regions V1, V2 (six in FIG. 4) is, however, different from that in the horizontal regions H1, H2 (eight in FIG. 4), which would cause a difference in line width or a difference in depth of focus between a pattern having vertical periodicity and a pattern having horizontal periodicity. In contrast, when the diffraction grating G is set as in the present embodiment to add the light source images (23*a*, ... ) formed by the ±first order diffraction beams, the number of light source images in the vertical regions V1, V2 (eighteen in FIG. 4) becomes equal to that in the horizontal regions H1, H2 (eighteen in FIG. 4), realizing the same imaging performance between a pattern having vertical periodicity and a pattern having horizontal periodicity.

Figure 5:
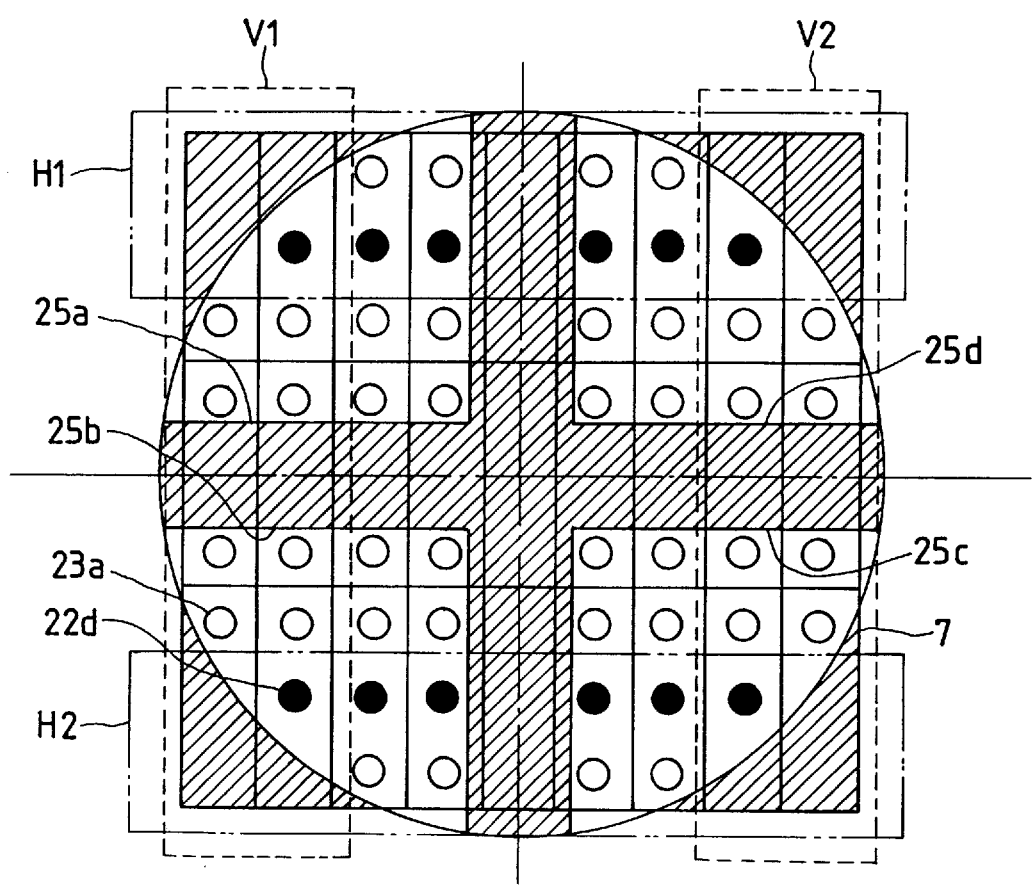
FIG. 5 is a drawing to show an arrangement in which an aperture stop for modified light source method is located on the exit plane side of the fly-eye lens in FIG. 1.

FIG. 5 shows a case in which an aperture stop for modified illumination method having four apertures 25*a* to 25*d* is located on the exit plane side of fly-eye lens 7. In FIG. 5, without the diffraction grating G of FIG. 1, light source images (22*d*, ... ) only by the zeroth order diffraction beam as represented by solid dots are formed within the apertures 25*a* to 25*d*. With only the light source images by the zeroth order diffraction beam the number of light source images in the vertical regions V1, V2 (four in FIG. 5) is, however, different from that in the horizontal regions H1, H2 (twelve in FIG. 5), which would cause a difference in line width or a difference in depth of focus between a pattern having vertical periodicity and a pattern having horizontal periodicity. In contrast, if the diffraction grating G is set as in the present embodiment to add light source images (23a, . . . ) formed by the ±first order diffraction beams, the number of light source images in the vertical regions V1, V2 (twenty in FIG. 5) becomes equal to that in the horizontal regions H1, H2 (twenty in FIG. 5), realizing the same imaging performance between a pattern having vertical periodicity and a pattern having horizontal periodicity.

The diffraction grating G employed in the present embodiment is next described in detail. As shown in FIG. 2, the diffraction grating G is a one-dimensional phase diffraction grating. Since almost all incident rays emerge from the phase diffraction grating, such a grating is advantageous in respect of the utilization factor of a quantity of illumination light as compared with an amplitude diffraction grating. It is also desirable that among diffraction beams emerging from the diffraction grating G the three diffraction beams of the zeroth order diffraction beam IL(0) and the ±first order diffraction beams IL(+1), IL(−1) are so arranged as to be nearly identical in intensity.

In order to obtain conditions for that, with the pitch P of diffraction grating G, let a be the width of projections Ga where the phase of phase grating G is 0 (radian) and b be the width of recesses Gb where the phase is δ (P=a+b). In this case the intensity $I_0$ of zeroth order diffraction beam, the intensity $I_{+1}$ of +first order diffraction beam and the intensity $I_{-1}$ of −first order diffraction beam are determined as follows with a constant A.

$$I_0 = A|a + b \cdot exp(i\delta)|^2 \quad (1)$$

$$I_{+1} = I_{-1} \quad (2)$$
$$= A|(P/\pi)\{\sin(\pi a/P) - \exp(i\delta)\sin(\pi b/P)\}|^2$$

Further calculation of formula (1) and formula (2) provides the following formulas.

$$I_0/A = P^2 - 2a(P-a)(1 - \cos \delta) \quad (3)$$

$$I_{+1}/A = I_{-1}/A \quad (4)$$
$$= (2P^2/\pi^2)\sin^2(\pi a/P)(1 - \cos\delta)$$

Therefore, if the width a and the phase δ are determined to equalize formula (3) with formula (4), the intensities of the three diffraction beams, i.e., the zeroth order diffraction beam IL(0) and the ±first order diffraction beams IL(+1), IL(−1), become substantially equal to each other.

Next, the value of pitch P of diffraction grating G differs depending upon the focal length of lens elements 7a, 7b, . . . in the fly-eye lens 7. Letting f be the focal length of lens elements and λ be the wavelength of illumination light IL1, then the light source image 22a by the zeroth order diffraction beam is separated by a distance Q, which is defined by the following formula, on the exit plane from the light source image 23a by the +first order diffraction beam (or from the light source image 24a by the −first order diffraction beam).

$$Q = (\lambda/P)f \quad (5)$$

Supposing the longitudinal length of each lens element 7a, 7b, . . . in the fly-eye lens 7 is ΔX and the transversal length thereof (in the direction perpendicular to the plane of FIG. 2) is ΔX/3, the longitudinal distance Q between the light source image by the zeroth order diffraction beam and the light source image by the +first order diffraction beam (or by the −first order diffraction beam) is determined as ΔX/3. This can make the longitudinal pitch of secondary light sources coincident with the transversal pitch thereof. From formula (5), the following is a condition for setting the distance Q to ΔX/3 accordingly.

$$(\lambda/P)f = \Delta X/3 \quad (6)$$

Specifically, consider an example in which the focal length f of lens elements is 60 mm, the longitudinal length ΔX of lens elements is 30 mm and the exposure wavelength λ is 0.365 μm. Then the pitch P of diffraction grating G is 2.19 μm from formula (6).

Meanwhile, in case of the aforementioned diffraction grating G being set in the vicinity of the entrance plane of fly-eye lens 7, it is conceivable that an image of diffraction grating G is formed on the reticle and on the wafer, which could be a cause of illuminance unevenness. In practice, however, the image of diffraction grating G will never be transferred onto the wafer because of the depth of focus. For example, if the imaging magnification is 1 (real size) between the entrance plane of each lens element in the fly-eye lens 7 and the wafer surface, a distance of only several μm (i.e., a distance equivalent approximately to the depth of focus on the wafer side of projection exposure apparatus) between the entrance plane of fly-eye lens 7 and the diffraction grating G can nullify a chance that the image of diffraction grating G is erroneously transferred onto the wafer. In practice, the diffraction grating G may be arranged several mm apart from the entrance plane of fly-eye lens 7. Also, the diffraction grating image is averaged on the wafer by illumination light from a plurality of lens elements, and, therefore, a chance of erroneous transfer of the image of diffraction grating G is low.

Particularly in case of the scanning exposure apparatus, the direction of diffraction grating G (direction of periodicity) shown in FIG. 3A may be arranged to be slightly inclined (or rotated) (for example about 1 mrad) relative to the scanning direction, so that the scanning exposure operation can average fine light quantity unevenness due to the transfer of diffraction grating, which could appear on the wafer. Then there is no concern as to the transfer of diffraction grating. In this case the direction of diffraction beams emerging from the diffraction grating is also delicately changed. Thus, the positions of light source images (23b, . . . ) represented by the blank circles in FIG. 3B are also finely shifted horizontally. Since the shift amount is very small, there is no adverse effect caused on the imaging properties.

Although the present embodiment (FIG. 1) employed a single stage of fly-eye lens 7, a second fly-eye lens (or rod type optical integrator) may be added closer to the light source than the fly-eye lens 7 and the optically transparent substrate 6, for example as disclosed in U.S. Pat. No. 4,497,015 or U.S. Pat. No. 4,918,583. It is preferable in this case that a cross section of each lens element in the second fly-eye lens is arranged to be substantially of a square or a regular hexagon matching with the contour of the fly-eye lens 7 shown in FIG. 3B. With the addition of the second stage fly-eye lens the light source images in FIG. 3B are multiplied so that even the number of light source images only by the zeroth order diffraction beam is not just one. The number of light source images by the zeroth order diffraction beam becomes equal to the number of lens elements in the second fly-eye lens. Of course, the number of light source images formed by each of the ±first order diffraction beams also becomes equal to the number of lens elements in the second fly-eye lens, which further enhances the illuminance uniformity on the surface of wafer.

The present embodiment employs the diffraction grating G to split the wavefront of a beam incident into the fly-eye lens 7, but the wavefront may be split using a blazed diffraction grating for example.

Figure 6:
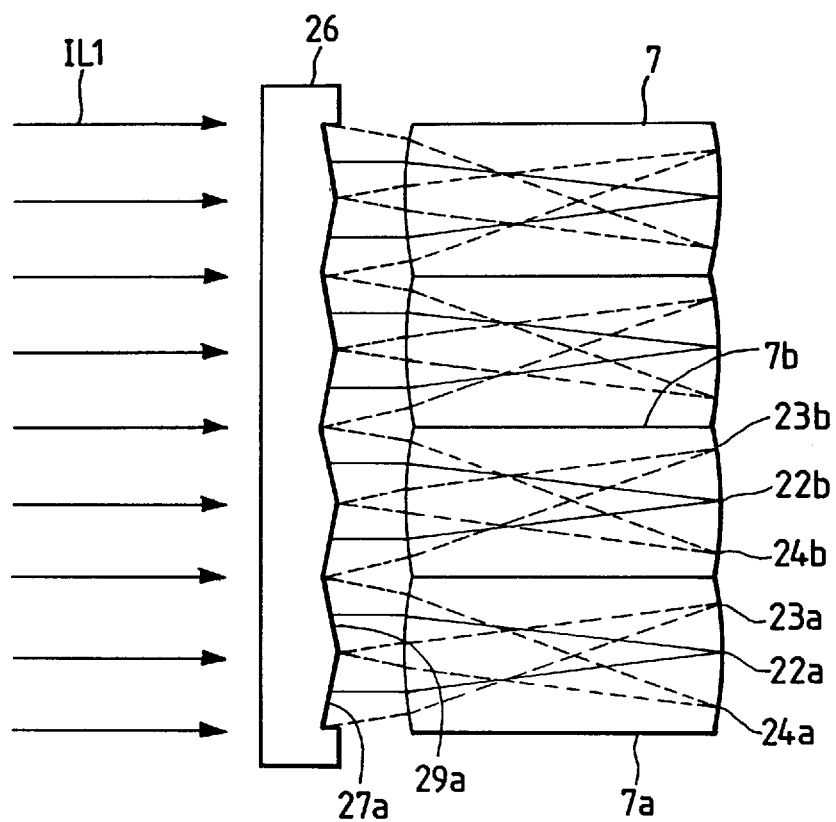
FIG. 6 is a drawing to show an arrangement in which a blazed diffraction grating is used as a wavefront splitting member.

FIG. 6 shows a state in which a blazed diffraction grating 26 is set in the vicinity of the entrance plane of fly-eye lens 7. In FIG. 6 the illumination light IL1 of nearly parallel rays is incident into the diffraction grating 26. Surfaces 27a inclined in the clockwise direction and surfaces 29a inclined in the counterclockwise direction are periodically formed at a predetermined pitch in the direction parallel to the plane of FIG. 6 on the exit-side surface of diffraction grating 26. A beam having passed through the diffraction grating 26 as it is (the zeroth order diffraction beam) forms a light source image 22a, 22b, . . . in the vicinity of the exit plane of each lens element 7a, 7b, . . . in the fly-eye lens 7. Also, a beam refracted by an inclined surface 27a forms a light source image 23a, 23b, . . . in the vicinity of the exit plane of each lens element 7a, 7b, . . . , while a beam refracted by an inclined surface 29a forms a light source image 24a, 24b, . . . in the vicinity of the exit plane of each lens element 7a, 7b, . . . . In FIG. 6 the blazed diffraction grating 26 has a pitch nearly equal to the pitch of fly-eye lens 7. Actually, the pitch of diffraction grating 26 is set to the same as the pitch of the above-described diffraction grating G in FIG. 2.

As described above, the wavefront of illumination light IL1 can be split using the blazed diffraction grating 26, so that the number of light source images formed on the exit plane of fly-eye lens 7 can be increased in a desired direction, whereby the longitudinal pitch of light source images can be readily equalized to the transversal pitch.

Also, the wavefront of illumination light IL1 may be split into two polarization components for example using a Wollaston prism as the wavefront splitting member.

Figure 7:
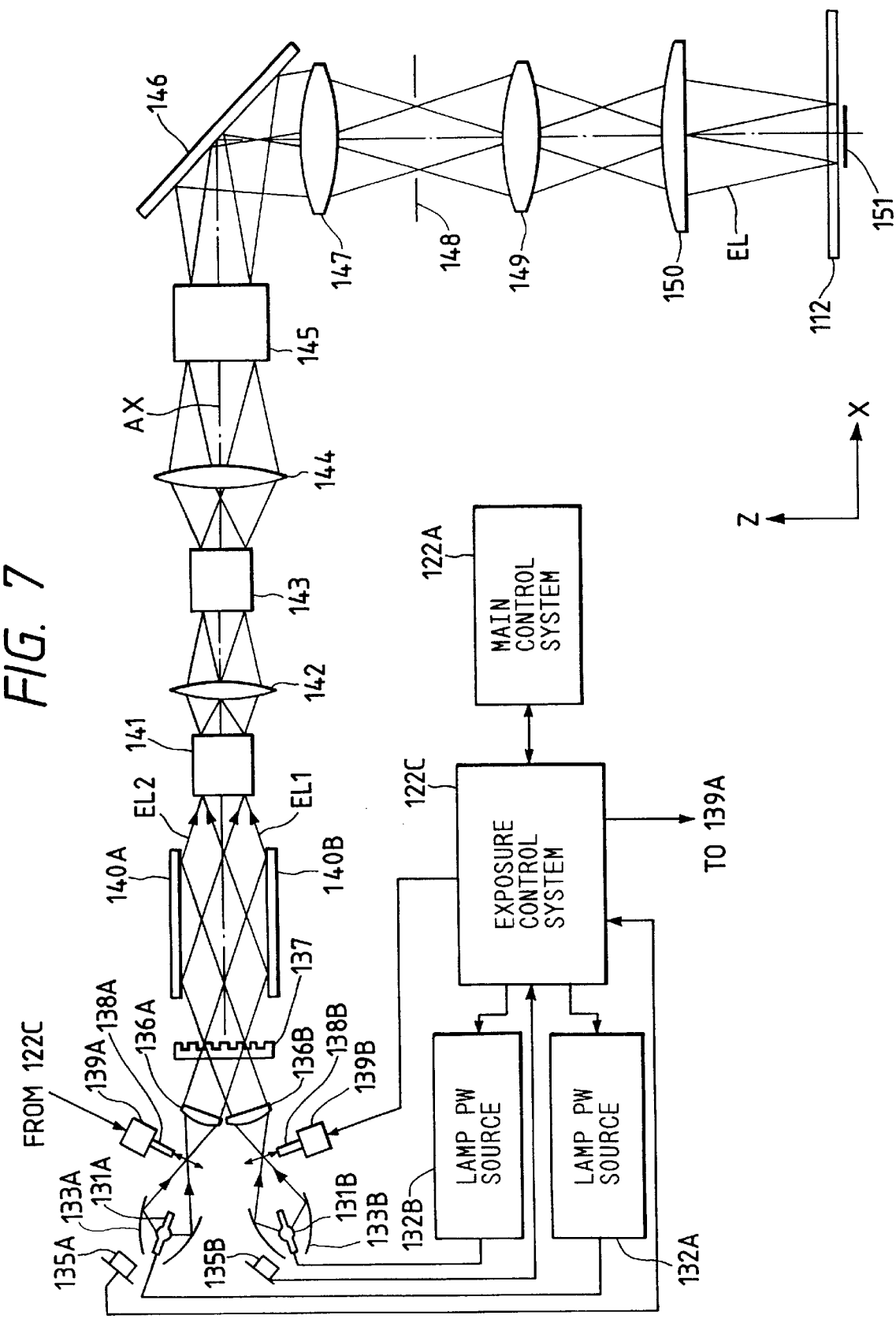
FIG. 7 is a drawing to show the structure of an illumination optical system according to a second embodiment of the present invention.
Figure 8:
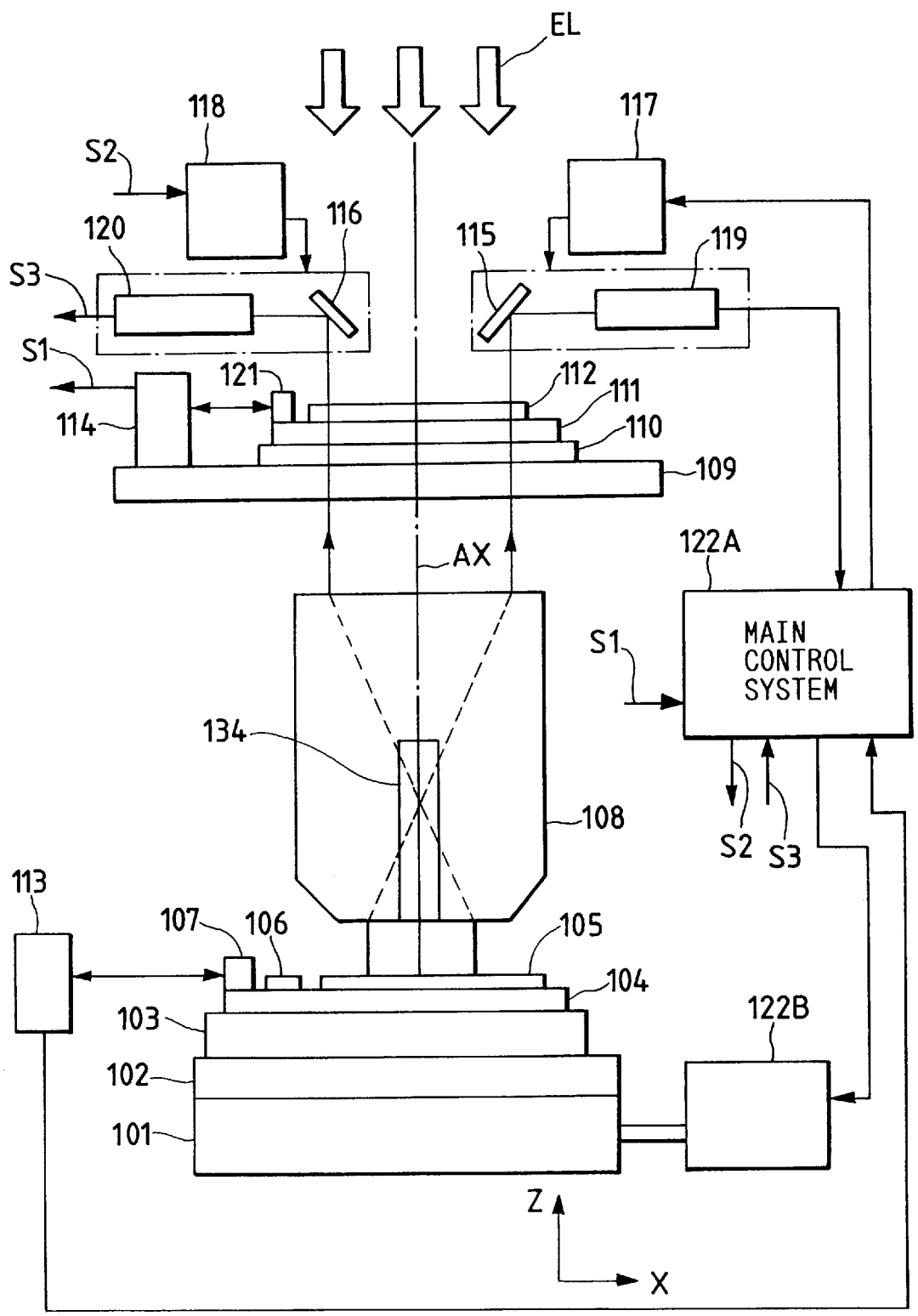
FIG. 8 is a drawing to show the structure of a projection exposure apparatus with which the illumination optical system in FIG. 7 is used.
Figure 9:
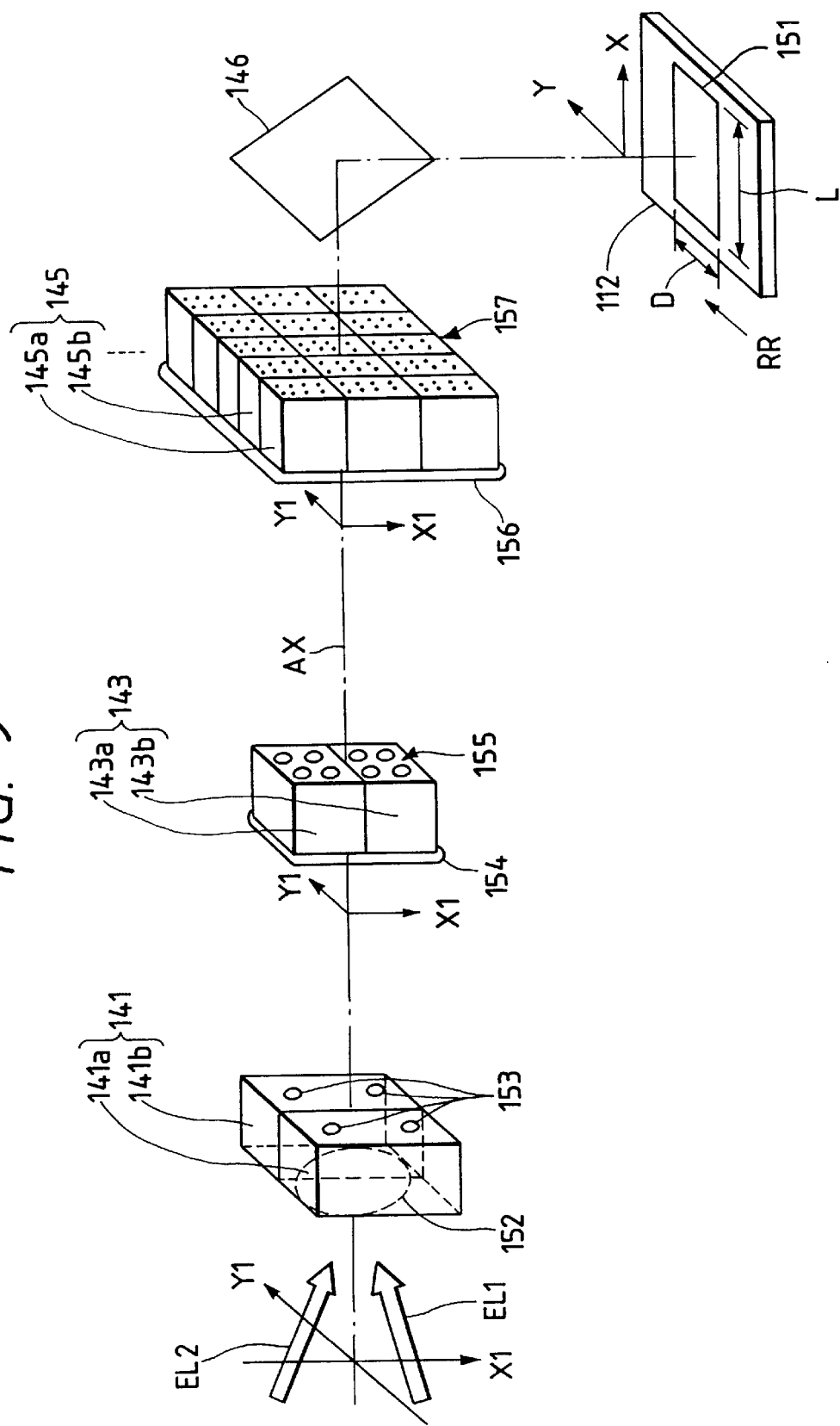
FIG. 9 is a drawing for illustration of three fly-eye lenses in FIG. 7.

The second embodiment of the present invention is next described referring to FIG. 7 to FIG. 9. In the present embodiment the present invention is applied to an illumination optical system in a scanning projection exposure apparatus.

FIG. 8 shows the scheme of the scanning projection exposure apparatus in the present embodiment. In FIG. 8, exposure light EL from an illumination optical system (FIG. 7) illuminates a local rectangular area on a reticle 112 and a projection optical system 108 projects an image of pattern in the illuminated area onto a wafer 5. During exposure by the slit scan method the reticle 12 is moved relative to the illumination area of exposure light EL at velocity V in a direction perpendicular to the plane of FIG. 1, for example out of the plane, and, in synchronization with the movement of reticle, the wafer 5 is moved relative to the illumination area at velocity V/M (where 1/M is a projection magnification of projection optical system 108) in a direction perpendicular to the plane of FIG. 1, for example into the plane.

Next described are driving systems for the reticle 112 and the wafer 105. A coarse motion stage 110 movable in the Y direction (the direction perpendicular to the plane of FIG. 8) is mounted on a support table 109. A fine motion stage 111 is further mounted on the Y stage 110 and a reticle 112 is held through a vacuum chuck on the fine motion stage 111. The fine motion stage 111 is arranged to be movable in the X direction, in the Y direction and in the rotational direction (θ direction) in a plane perpendicular to the optical axis AX of projection optical system 108, so that it controls the position of reticle 12 by a fine amount and with high precision in each direction. A moving mirror 121 is set on the fine motion stage 111 whereby an interferometer 114 on the support table 109 always monitors the position of the fine motion stage 111 in the X direction, in the Y direction and in the θ direction. Position information S1 obtained from the interferometer 114 is supplied to a main control system 122A.

On the other hand, a Y stage 102 movable in the Y direction is mounted on a support table 101 and an X stage 103 movable in the X direction is mounted on the Y stage 102. Further, a Z stage 104 movable in the Z direction is set on the X stage 103 and the wafer 105 is held through a finely rotatable wafer holder (θ table) on the Z stage 104. A moving mirror 7 is fixed on the Z stage 104 whereby an interferometer 113 disposed outside always monitors the position of Z stage 104 in the X direction, in the Y direction and in the θ direction. Position information obtained from the interferometer 113 is supplied to the main control system 112A. The main control system 122A controls positioning operations of the Y stage 102 to the Z stage 104 through a drive unit 22B, and totally controls the operations of the entire apparatus.

Although detailed later, a reference mark plate 106 is fixed near the wafer 105 on the Z stage 104 in order to attain a correspondence between the wafer coordinate system defined by the interferometer 113 and the reticle coordinate system defined by the interferometer 114. There are various marks formed on the reference mark plate 106. One of the reference marks is a reference mark illuminated from the back by the illumination light guided into the Z stage 104, which is a radiative reference mark.

Alignment microscopes 119, 120 are arranged above the reticle 112 of the present embodiment in order to simultaneously observe a reference mark on the reference mark plate 106 and a mark on the reticle 112. Further, there are movable mirrors 115, 116 for guiding detection light from the reticle 112 to the alignment microscopes 119, 120, respectively. With start of exposure sequence drive units 117, 118 withdraw the mirrors 115, 116, respectively, out of the optical path of exposure light EL under a command from the main control system 122A.

FIG. 7 shows the illumination optical system in the present embodiment. In FIG. 7, a current is supplied under a predetermined voltage from a lamp power source 132A, 132B to a first light source 131A or a second light source 131B of a mercury lamp. An elliptic mirror 133A, 133B is provided for collecting light from the first or second light source 131A, 131B, respectively. A light source check sensor 135A, 135B is disposed near the back face of the elliptic mirror 133A, 133B, respectively. The first light source check sensor 135A is composed of a photoreceptor for receiving leaking light from the elliptic mirror 133A and a timer for integrating a time while a photoelectric conversion signal from the photoreceptor exceeds a predetermined level. The second light source check sensor 135B is similarly constructed.

The first light source check sensor 135A supplies information concerning a lighting time of the first light source 131A and information concerning whether the first light source 131A is on at the moment to an exposure amount control system 122C for performing a control concerning an exposure amount. Similarly, the second light source check sensor 135B supplies information concerning a lighting time of the second light source 131B and information concerning whether the second light source 131B is on at the moment to the exposure amount control system 122C. An internal timer in the first or second light source check sensor 135A, 135B is reset when the corresponding first or second light source 131A, 131B is exchanged. The exposure amount control system 122C controls lighting/unlighting operations of the first and second light sources 131A, 131B through the lamp power sources 132A, 132B, respectively.

After the illumination light emitted from the first light source 131A (for example, the i line of wavelength 365 nm) is converged by the elliptic mirror 133A, an input lens 136A converts it into a beam of nearly parallel rays, which is let to enter a diffraction grating plate 137 at a predetermined incident angle. Similarly, the illumination light emitted from the second light source 131B (for example, the i line of wavelength 365 nm) is converged by the elliptic mirror 133B, and thereafter it is converted into a beam of nearly parallel rays by an input lens 136B. Then the beam is incident into the diffraction grating 137 at an incident angle symmetric with the illumination light from the first light source 131A with respect to the optical axis of illumination optical system (a chain line in the drawing). Shutters 138A, 138B are located near the second foci of the respective elliptic mirrors 133A, 133B, so that the exposure amount control system 122C can control an exposure amount (exposure time) by opening or closing the shutters 138A, 138B through respective drive units 139A, 139B.

The diffraction grating plate 137 is so arranged that a diffraction grating pattern of projections and recesses is formed at a predetermined pitch in the direction parallel to the plane of FIG. 7 on a glass substrate (for example a quartz substrate) which is transparent for the illumination light. The pitch of the diffraction grating pattern is so determined that a zeroth order diffraction beam and a first order diffraction beam emergent from the diffraction grating pattern with irradiation of illumination light from the first light source 131A are outgoing symmetric with each other with respect to the normal line to the diffraction grating plate 137. Also, the depth of grooves formed by the projections and recesses in the diffraction grating pattern on the diffraction grating plate 137 is so determined that a light quantity of the zeroth order diffracted beam and a light quantity of the first order diffracted beam outgoing symmetric with each other relative to the normal line to the diffraction grating plate 137 are equal to each other.

In the present embodiment, the illumination light from the second light source 131B is incident into the diffraction grating plate 137 as being symmetric with the illumination light from the first light source 131A with respect to the optical axis of the illumination optical system (the normal line to the diffraction grating 137) as described above. Thus, emergent from the diffraction grating plate 137 in symmetry with each other with respect to the optical axis AX of illumination optical system are a first illumination light beam EL1, which is obtained by combining the zeroth order diffraction beam emergent from the diffraction grating pattern with irradiation of illumination light from the first light source 131A, with the −first order diffraction beam emergent from the diffraction grating pattern with irradiation of illumination light from the second light source 131B on a same axis, and a second illumination light beam EL2, which is obtained by combining the +first order diffraction beam emergent from the diffraction grating pattern with irradiation of illumination light from the first light source 131A with the zeroth order diffraction beam emergent from the diffraction grating pattern with irradiation of illumination light from the second light source 131B on a same axis.

Then the first illumination beam EL1 from the diffraction grating plate 137 is reflected by a mirror 140B to enter a first fly-eye lens 141 at a predetermined incident angle, while the second illumination beam EL2 is reflected by a mirror 140A to enter the first fly-eye lens 141 as being symmetric with the first illumination beam EL1 with respect to the optical axis AX of the illumination optical system. A cross section of each lens element in the first fly-eye lens 141 is rectangular with the longitudinal direction along the direction parallel to the plane of FIG. 7, and two light source images are formed along the longitudinal direction on the exit plane of each lens element.

Beams from a plurality of light source images on the exit plane of the first fly-eye lens 141 are guided through a first relay lens 142 into a second fly-eye lens 143 to form more light source images on the exit plane of the second fly-eye lens 143. Beams from these light source images are guided through a second relay lens 144 into a third fly-eye lens 145 to form still more light source images on the exit plane of the third fly-eye lens 145. Beams from the numerous light source images formed on the exit plane of the third fly-eye lens 145 are guided via a mirror 146, a third relay lens 147, a field stop (reticle blind) 148, a fourth relay lens 149 and a main condenser lens 150 to illuminate a rectangular illumination area 151 on the reticle 112 with uniform illuminance. Here, a normal aperture stop having a circular (or rectangular) aperture, or an aperture stop for annular illumination or for modified light source may be placed in the vicinity of the exit plane of the third fly-eye lens 145.

The present embodiment is so arranged that the entrance plane of the first fly-eye lens 141 is conjugate with each of the entrance plane of second fly-eye lens 143, the entrance plane of third fly-eye lens 145, the setting plane of reticle blind 148 and the pattern-formed surface of the reticle 112. Further, the shape of the rectangular illumination area 151 on the reticle 114 is similar to the cross section of each lens element as a constituent of the third fly-eye lens 145. Accordingly, the reticle blind 148 has a role to cut the peripheral portion of the illumination area 151 thus determined by the cross section of lens elements.

Next described in detail referring to FIG. 9 is a state of the light source images in the illumination optical system of the present embodiment. FIG. 9 shows the main elements in the illumination optical system of FIG. 7. In FIG. 9, the illumination area 151 on the reticle 112 is rectangular as elongate in the X direction with the X-directional width being L and the Y-directional width being D (D<L). In FIG. 9, the reticle blind 148 and the lens systems of FIG. 7 are omitted. During exposure by the slit scan method the reticle 112 is moved along the Y direction, i.e., in the direction of the short sides of the illumination area 151. In this case, directions in the first to third fly-eye lenses 141, 143, 145 corresponding to the X direction and the Y direction on the reticle 112 are defined as X1 direction and Y1 direction, respectively. For convenience of description, it is assumed that the first fly-eye lens 141 is composed of two lens elements 141a, 141b arranged in the Y1 direction and that the second fly-eye lens 143 is composed of two lens elements 143a, 143b arranged in the X1 direction. A cross section of lens element 141a, 141b is of a rectangle in which a ratio between the X1-directional width and the Y1-directional width is 2:1, and a cross section of lens element 143a, 143b is square.

Also, the third fly-eye lens 145 is composed of lens elements 145a, 145b, . . . as arranged in five columns in the Y1 direction and three rows in the X1 direction, and a ratio between the X1-directional width and the Y1-directional width of each lens element is 5:3. Accordingly, the entire first fly-eye lens 141 has such a cross section that a ratio between the X1-directional length and the Y1-directional length is 1:1 (square). The entire second fly-eye lens 143 has such a cross section that a ratio between the X1-directional length and the Y1-directional length is 2:1. The entire third fly-eye lens 145 has such a cross section that a ratio between the X1-directional length and the Y1-directional length is 1:1 (square).

In this case, the first illumination beam EL1 and the second illumination beam EL2 enter a substantially circular region 152 on the entrance plane of first fly-eye lens 141 in symmetry with each other with respect to the optical axis AX, along the ±X1 directions. Consequently, two light source images 153 are formed along the X1 direction on the exit plane of each lens element in the first fly-eye lens 141 (four light sources are formed in total). Also, illumination beams from the light source images 153 illuminate a rectangular region 154 substantially equal to the cross section of the entire second fly-eye lens 143, on the entrance plane of second fly-eye lens 143, whereby light source images 155 of two rows in the X1 direction and two columns in the Y1 direction are formed on the exit plane of each lens element in the second fly-eye lens 143 (eight light source images are formed in total in the entire second fly-eye lens). Similarly, illumination beams from the light source images 155 illuminate a square region 156 substantially equal to the cross section of the entire third fly-eye lens 145, on the entrance plane of third fly-eye lens 145, whereby light source images 157 of four rows in the X1 direction and two columns in the Y1 direction are formed on the exit plane of each lens element in the third fly-eye lens 145. The total number of light source images formed on the exit plane of the third fly-eye lens 145 is 120 (=8×5×3).

Then illumination beams from the 120 light source images 157 formed by the third fly-eye lens 145 illuminate the rectangular illumination area 151 on the reticle 112 in a superimposed manner. Since the ratio between the X1-directional length and the Y1-directional length of each lens element in the third fly-eye lens 145 is 5:3, a ratio of the X-directional length L and the Y-directional length D of the illumination area 151 is 5:3. In this case, since the illumination beams EL1, EL2 are made incident along two directions (±X1 directions) into the first fly-eye lens 141 composed of the lens elements 41a, 41b with a cross section long in the X1 direction in the present embodiment, the density of light source images in the X1 direction is doubled so as to improve the illuminance uniformity in the X direction in the illumination area 151. It should be noted that FIG. 9 shows a reduced number of lens elements for each of the first to the third fly-eye lenses 141, 143, 145 for brevity of description, but more lens elements are used in practice.

Figure 10A:
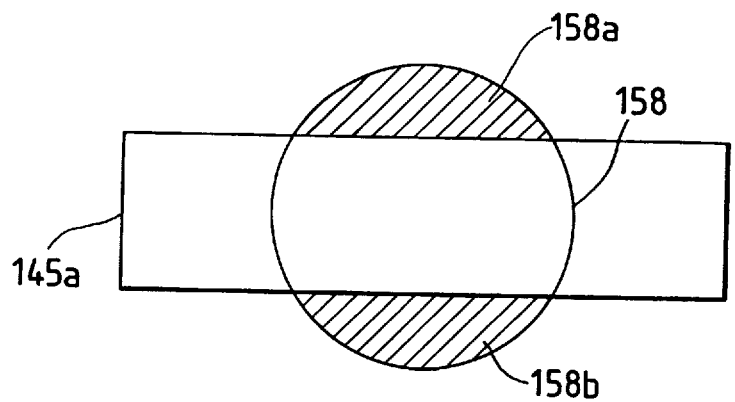
FIG. 10A and FIG. 10B are drawings to show a light source image or light source images on the exit plane of each lens element in the fly-eye lens.
Figure 10B:
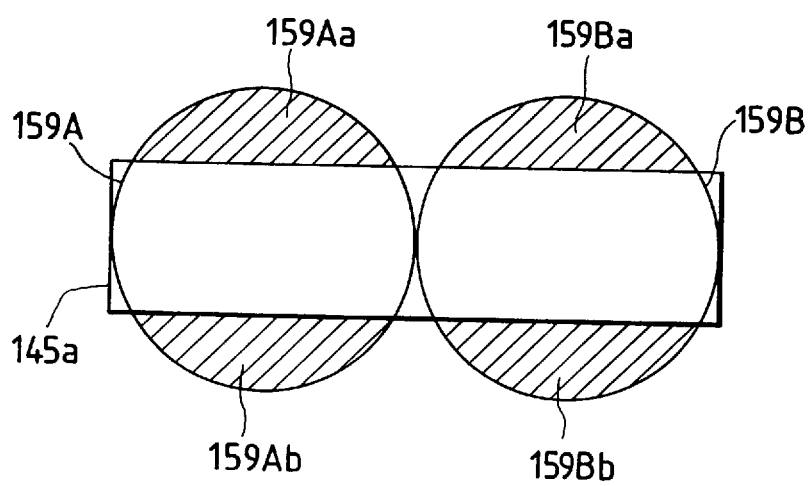

FIG. 9 showed an example in which the aspect ratio of the illumination area 151 on the reticle 112 was 5:3. If this ratio becomes larger, an eclipse will occur as shown in FIGS. 10A and 10B. FIG. 10A shows an exit plane of lens element 145a in the fly-eye lens in a case in which the illumination light is guided into the fly-eye lens in one direction. In FIG. 10A, it is seen that with a large spot 158 of a light source image, hatched portions 158a, 158b are eclipsed in the spot 158 of the light source image in the direction of short sides of lens element 145a. The eclipse reduces a quantity of light reaching the reticle 112.

On the other hand, FIG. 10B shows a case in which the illumination light is made incident along two directions in the longer-side direction of lens element 145a. In FIG. 10B, two spots 159A, 159B of light source images are formed in parallel in the longer-side direction on the exit plane of lens element 145a. Also in this case, hatched portions 159Aa, 159Ab in the spot 159A and hatched portions 159Ba, 159Bb in the spot 159B are eclipsed, but the marginal field in the longitudinal direction can be effectively used, so that a light quantity of illumination light can be almost doubled as compared with FIG. 10A.

Returning to FIG. 7, an example of a method for using the two light sources 131A, 131B is next described. First, for example even if the first light source 131A is burned out (or turned off), the illumination light from the second light source 131B enters the first fly-eye lens 141 in two directions in the present embodiment. Accordingly, the density of light source images is unchanged on the exit plane of the first fly-eye lens 141, so that there is no change in uniformity of illuminance distribution observed on the reticle 112. Also, in order to keep a predetermined exposure amount on wafer 105 with use only of the second light source 131B equal to that with use of both the two light sources 131A, 131B, the scanning velocities of the reticle 112 and the wafer 105 are to be decreased by half, for example. Then, for example during exchange or adjustment of the first light source 131A, the exposure on the wafer 105 can be continued with lighting only the second light source 131B.

There are cases not necessarily requiring a light quantity of synthesized illumination beams from the two light sources 131A, 131B, for example in case of the wafer 105 of FIG. 8 being coated with a high-sensitivity photoresist. In such a case, the exposure amount control system 122C turns off one of the first and second light sources 131A, 131B through the lamp power source 132A, 132B under a command from the main control system 122A in FIG. 7. This can extend the life of the two light sources 131A, 131B in total.

If for example only the first light source 131A is turned on for a high-sensitivity photoresist and when the lighting time as integrated in the first light source check sensor 135A reaches the life of the light source, the exposure amount control system 122C lights the second light source 131B through the lamp power source 132B. After that, the exposure amount control system 122C opens the shutter 138B for the second light source 131B and simultaneously closes the shutter 138A for the first light source 131A, through the driving units 139A, 139B. By this, switching to the second light source 131B can be done before the first light source 131A is burned out, whereby interruption of exposure operation can be avoided.

Figure 11:
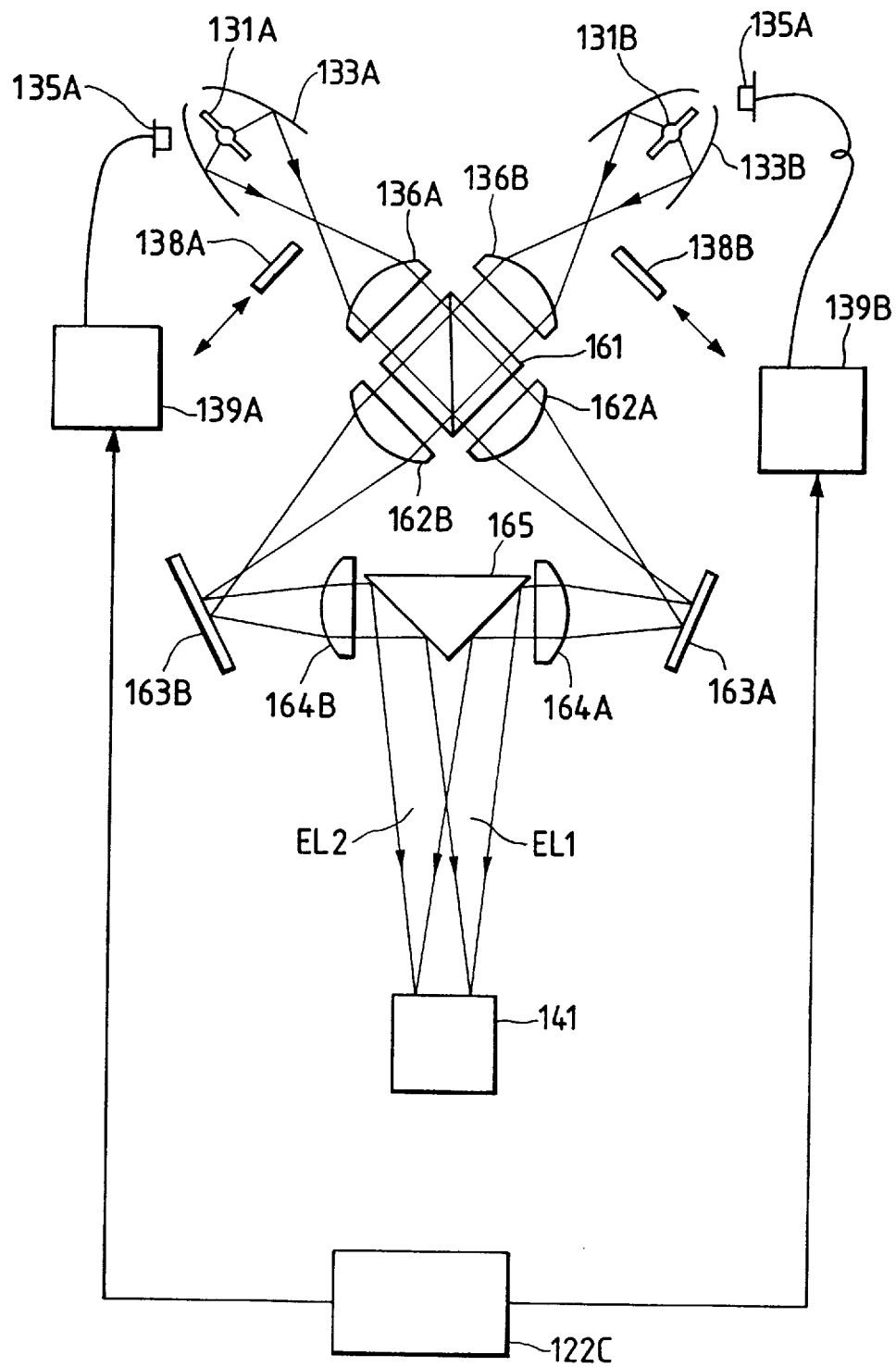
FIG. 11 is a drawing to show a modification of the illumination optical system in the second embodiment.

A modification of the second embodiment is next described referring to FIG. 11. In FIG. 11, portions corresponding to those in FIG. 7 are denoted by the same reference numerals and so will not be explained in detail. The illumination optical system of this example is different only in the light source system up to the first fly-eye lens 141 from the illumination optical system in FIG. 7. Therefore, the following description is focused on the light source system.

In FIG. 11, illumination light from the first light source 131A is collected by an elliptic mirror 133A and then passes through an input lens 136A to enter a half prism 61. The illumination light is split into a first beam and a second beam by the half prism 161. The first beam passing through the half prism 161 advances via a relay lens 162A, a mirror 163A and a relay lens 164A and thereafter is reflected by a first reflecting surface of a triangular prism 165 to a first fly-eye lens 141. On the other hand, the second beam reflected by the half prism 161 advances via a relay lens 162B, a mirror 163B and a relay lens 164B and thereafter is reflected by a second reflecting surface of the triangular prism 165 to the first fly-eye lens 141 in a direction different from that of the first beam. The half prism 161 is of a type having 50% reflection and 50% transmission, so that a beam from the first light source 131A is split into the first beam, and the second beam 50% each, to illuminate the first fly-eye lens 141 in two directions.

Also, a beam from a second light source 131B is collected by an elliptic mirror 131B and then passes through an input lens 136B to enter the half prism 161. The plane of incidence in this case is a surface orthogonal to the incident plane of the illumination beam from the first light source 131A. The illumination beam incident into this surface is split by the half prism 161. A first beam reflected by the half prism 161 of the illumination light from the second light source 131B is combined with the first beam passing through the half prism 161 of the illumination light from the first light source 131A, forming a first illumination beam EL1. Also, a second beam passing through the half prism 161 of the illumination light from the second light source 131B is combined with the second beam reflected by the half prism 161 of the illumination light from the first light source 131A, forming a second illumination beam EL1.

By this arrangement, the first and second beams EL1, EL2, which are synthesized from the beams from the first and second light sources 131A, 131B, are incident at mutually different incident angles on the first fly-eye lens 141. Accordingly, light source images corresponding to the first and second beams EL1, EL2 are formed with approximately the same light quantity on the exit plane of the first fly-eye lens 141. Since FIG. 11 employs the half prism 161 as the beam splitting optical system, the illumination beams from the first and second light sources 131A, 131B are supplied without any loss to the first fly-eye lens 141. Although FIG. 11 is more complex in structure than FIG. 7, it is effective in case of illumination light with wide wavelength bandwidth or in case of large light source images, because the efficiency of splitting and synthesis is 100% and it uses no diffraction.

Similarly as the embodiment of FIG. 7, this example also employs such an arrangement that shutters 138A, 138B for adjusting the illumination light from the first and the second light sources 131A, 131B are arranged to be driven by driving units 139A, 139B, respectively. In addition, light source check sensors 135A, 135B generate warnings concerning the lamp life and lighting (unlighting) of the first and the second light sources 131A, 131B to the exposure amount control system 122C.

In the second embodiment as described above, the illumination beams from the two light sources 131A, 131B are made incident at mutually different incident angles into the beam splitting optical system (for example the diffraction grating plate 137 in FIG. 7). However, the illumination beams from the two light sources 131A, 131B may be arranged to be supplied into the beam splitting optical system approximately in parallel with each other. Also, using three or more light sources, illumination beams therefrom may be arranged to be split and synthesized in the same manner as described above. Further, the second embodiment illustrates modes in which an illumination beam emitted from each of the plural light sources was split into two beams, but an illumination beam from each light source may be split into three or more beams and a plurality of corresponding beams (in a same number as the number of light sources) may be arranged to be synthesized on a same axis to enter the first fly-eye lens 141.

Figure 12:
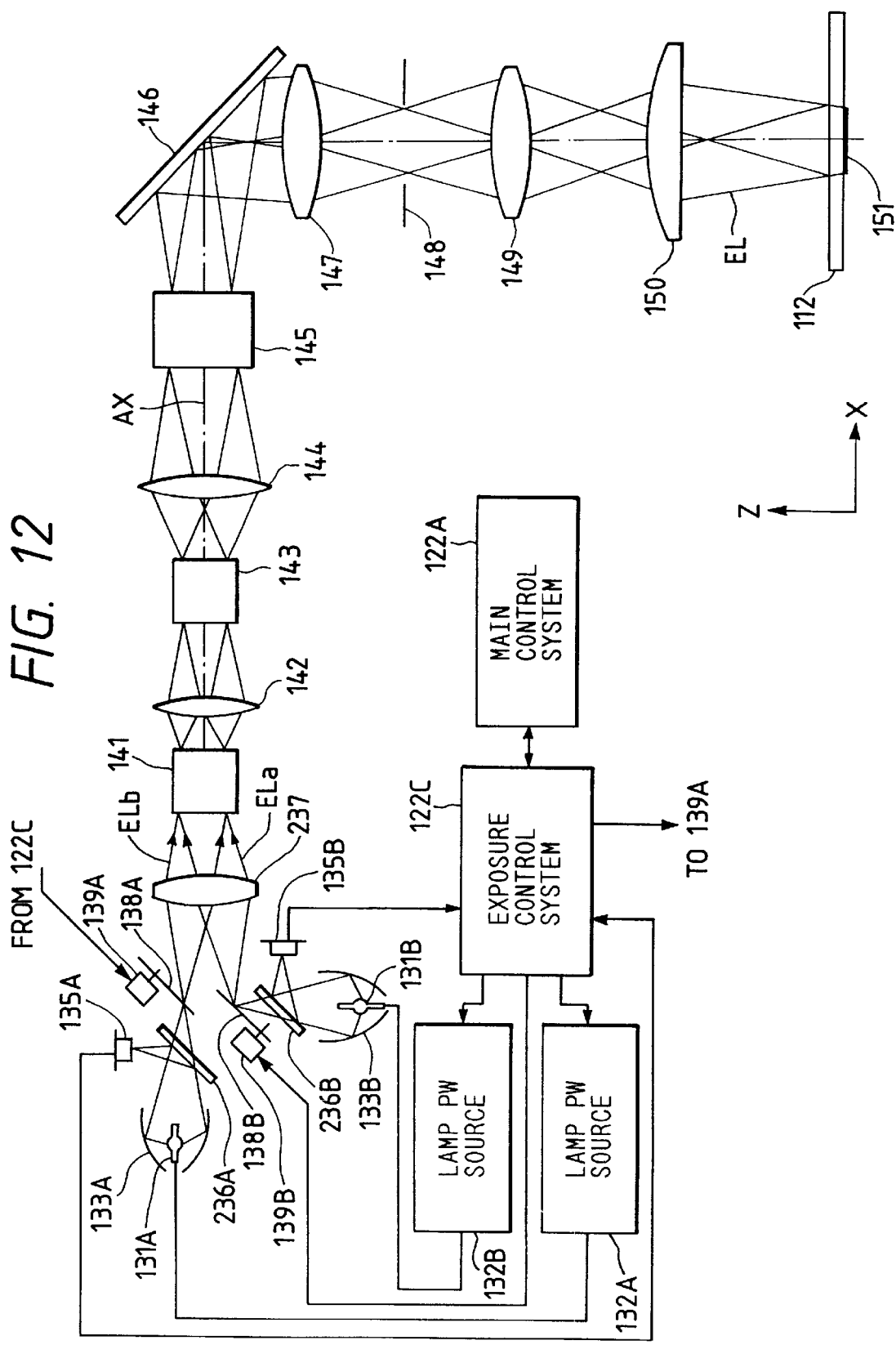
FIG. 12 is a drawing to show the structure of an illumination optical system according to a third embodiment of the present invention.

The third embodiment of the present invention is next described referring to FIG. 12. In FIG. 12, members with the same functions and operations as those in FIG. 7 are denoted by the same reference numerals and so will not be explained again. The illumination optical system of the present embodiment is different only in the light source system up to the first fly-eye lens 141 from the illumination optical system of FIG. 7. Therefore, the following description is focused only on the light source system.

In FIG. 12, an illumination beam ELa emitted from a first light source 131A (for example, the i line of wavelength 365 nm) is collected by an elliptic mirror 133A and thereafter is converted into a beam of nearly parallel rays by an input lens 237 and enters a first fly-eye lens 141 at a predetermined incident angle. An illumination beam ELb emitted from a second light source 131B (for example, the i line of wavelength 365 nm) is collected by an elliptic mirror 133B and thereafter is reflected by a reflecting surface of shutter 138B. Then the illumination beam ELb is converted into a beam of nearly parallel rays by input lens 237 and enters the first fly's lens 141 at an incident angle symmetric with the illumination beam from the first light source 131A with respect to the optical axis AX of illumination optical system. The shutter 138B is located near the second focus of the elliptic mirror 133B. Also, a shutter 138A is located near the second focus of the elliptic mirror 133A, and an exposure amount control system 122C controls for example an exposure amount by opening or closing the shutters 138A, 138B through driving units 139A, 139B, respectively.

A half mirror 236A with a small reflectivity is located between the first light source 131A and the shutter 138A, so that a photoreceptor 135A receives the illumination light reflected by the half mirror 236A. On the other hand, another half mirror 236B with a small reflectivity is also located between the second light source 131B and the shutter 138B, so that a photoreceptor 135B receives the illumination light reflected by the half mirror 236B. Photoelectric conversion signals from the photoreceptors 135A, 135B are supplied to the exposure amount control system 122C. The exposure amount control system 122C controls emission power of the first and second light sources 131A, 131B through lamp power sources 132A, 132B such that levels (voltage values) of the photoelectric conversion signals from the photoreceptors 135A, 135B become approximately equal to each other. This can equalize light quantities (illuminance values) of the two illumination beams ELa, ELb incident at different angles into the first fly-eye lens 141 with each other.

As described above, the present embodiment can keep the illuminance uniformity unchanged on the reticle, even though the illuminance is increased using a plurality of light sources, by equalizing the emission power of the first and second light sources 131A, 131B with each other based on the photoelectric conversion signals from the photoreceptors 135A, 135B. The present embodiment is so arranged that the illumination beams from the two light sources 131A, 131B are incident at different angles into the first fly-eye lens 141. The illumination beams from the two light sources 131A, 131B may be, however, arranged to be incident into the first fly-eye lens 141 approximately in parallel with each other along the longitudinal direction of lens elements, because the cross section of each lens element in the first fly-eye lens 141 is rectangular. In this case, in order to further enhance the illuminance uniformity, such an arrangement may be employed that illumination beams from a plurality of light sources are made incident in parallel into the fly-eye lens and three more fly-eye lenses are arranged after the first one (four fly-eye lenses in total).

Incidentally, four or more fly-eye lenses may be employed, though the second and third embodiments as described above employ three fly-eye lenses. Also, at least one of the plurality of fly-eye lenses may be replaced by a rod optical integrator. Further, the number of light sources may be three or more. Although the above embodiments employ a mercury lamp as a light source, the present invention can be applied to cases where a light source of illumination beam is an excimer laser source, a light source for generating harmonics of argon laser beam, or another lamp light source. Especially in case of a laser light source being employed as a light source, the speckle pattern on the surface of wafer can be decreased with application of the present invention. Further, the present invention can be applied not only to the scanning projection exposure apparatus but also to the projection exposure apparatus of the full exposure method such as ordinary steppers. In particular, in case the illumination area on the reticle is rectangular, an increase in illuminance of illumination beam and an improvement in illuminance uniformity can be expected with application of the present invention.

What is claimed is:

1. An illumination optical apparatus comprising:
   a light source image forming member which forms a plurality of light source images from light that is incident thereon from a light source;
   a condenser optical system, disposed on an exit side of said light source image forming member, which condenses beams from said plurality of light source images to illuminate an area in a predetermined plane in a superimposed manner; and
   a wavefront splitting member disposed on an entrance side of said light source image forming member, and which splits a wavefront of the light from said light source into a plurality of wavefronts so as to increase the number of the light source images formed by said light source image forming member.

2. An apparatus according to claim 1, wherein said light source image forming member is a fly-eye type optical integrator, an exit plane of which is located on or near a plane which is in a Fourier transform relation with said predetermined plane.

3. An apparatus according to claim 1, wherein said light source image forming member is a fly-eye type optical integrator including a plurality of optical elements rectangular in cross section, and wherein said wavefront splitting member comprises a diffraction grating disposed to form a plurality of diffraction beams from incident light from said light source and to emit the diffraction beams along a plane which is perpendicular to an entrance plane of said fly-eye type optical integrator and substantially parallel to a longitudinal direction of the cross sections of said optical elements.

4. An apparatus according to claim 1, wherein said light source image forming member is a fly-eye type optical integrator including a plurality of optical elements rectangular in cross section, and wherein said wavefront splitting member comprises a one-dimensional diffraction grating arranged substantially along a longitudinal direction of the cross sections of said optical elements.

5. An apparatus according to claim 1, wherein said area in said predetermined plane has an aspect ratio of 1:n (n is an integer more than 1); and
   said wavefront splitting member splits the wavefront of the light from said light source into n wavefronts to be incident on said light source image forming member.

6. An apparatus according to claim 1, wherein said wavefront splitting member makes pitches of the light source images equal along two perpendicular directions.

7. An illumination optical apparatus according to claim 1, wherein said wavefront splitting member is disposed in a vicinity of an entrance plane of said light source image forming member.

8. An illumination optical apparatus according to claim 1, wherein no optical member intervenes between said wavefront splitting member and said light source image forming member.

9. An illumination optical apparatus comprising:
   a light source;
   a fly-eye type optical integrator including a plurality of optical elements rectangular in cross section, and which forms a plurality of images of said light source;
   a diffraction grating plate disposed between said light source and said fly-eye type optical integrator, and which causes a plurality of diffracted light beams to enter said fly-eye type optical integrator from different directions, including a direction perpendicular to an entrance plane of said fly-eye type optical integrator, so as to increase the number of the light source images on or in a vicinity of an exit plane of each said optical element along a longitudinal direction of the cross sections of said optical elements; and
   a condenser optical system which condenses a beam from each of the light source images formed by said fly-eye type optical integrator to illuminate an area in a predetermined plane.

10. An apparatus according to claim 5, wherein said diffraction grating plate is arranged to emit said plurality of diffracted light beams such that intensities of said diffracted light beams illuminating said area in said predetermined plane are substantially uniform.

11. An exposure apparatus for exposing a pattern on a mask onto a substrate, comprising:
    a light source image forming member which forms a plurality of light source images from light that is incident thereon from a light source;
    a wavefront splitting member disposed on an entrance side of said light source image forming member, and which splits a wavefront of the light from said light source into a plurality of wavefronts so as to increase the number of the light source images formed by said light source image forming member;
    a condensing optical system, disposed between said light source image forming member and said mask, which condenses beams from the light source images to illuminate said mask in a superposed manner; and
    a projection optical system disposed between said mask and said substrate, which projects said pattern onto said substrate.

12. An exposure apparatus according to claim 11, further comprising an aperture stop provided near an exit plane of said light source image forming member.

13. An exposure apparatus according to claim 11, wherein an illumination area for illuminating said mask is an elongated slit-like shape.

14. An exposure apparatus according to claim 11, wherein an aspect ratio of an illumination area for illuminating said mask is substantially the same as an aspect ratio of a cross section of said light source image forming member.

15. An exposure apparatus according to claim 11, wherein said light source image forming member is a fly-eye type optical integrator, an exit plane of which is located on or near a plane which is in a relation of Fourier transform with a surface of said mask on which said pattern is formed, and said wavefront splitting member is disposed near an entrance plane of said fly-eye type optical integrator.

16. An exposure apparatus according to claim 11, wherein said light source image forming member is a fly-eye type optical integrator having a plurality of optical elements rectangular in cross section, and said wavefront splitting member comprises a diffraction grating onto which the light from said light source is incident and from which a plurality of diffraction beams are emergent along a plane perpendicular to an entrance plane of said fly-eye type optical integrator and nearly parallel to a longitudinal direction of said optical elements.

17. An exposure apparatus according to claim 11, wherein said light source image forming member is a fly-eye type optical integrator having a plurality of optical elements rectangular in cross section, and said wavefront splitting member comprises a one-dimensional diffraction grating arranged substantially along a longitudinal direction of said optical elements.

18. An exposure apparatus according to claim 11, and which is a slit-scan type scanning exposure apparatus.

19. An apparatus according to claim 11, further comprising an aperture stop disposed in a vicinity of said light source image forming member to enhance at least one of resolving power and depth of focus of said projection optical system.

20. An apparatus according to claim 19, wherein:

light source images formed in a first area on or near an exit plane of said light source image forming member enhance one of resolving power and depth of focus for a pattern formed on said mask with a periodicity in a first direction;

a light source images formed in a second area on or near the exit plane of said light source image forming member enhance one of resolving power and depth of focus for a pattern formed on said mask with a periodicity in a second direction perpendicular to said first direction; and the number of light source images formed in said first area and the number of light source images formed in said second area are substantially equal to each other.

21. An apparatus according to claim 11, wherein said wavefront splitting member is a diffraction grating having recesses and projections formed at a predetermined pitch, said pitch being related to a focal length of said light source image forming member.

22. An apparatus according to claim 11, wherein said wavefront splitting member is a diffraction grating which emits a plurality of diffracted light beams to illuminate said mask, and intensities of the plurality of diffracted light beams which illuminate said mask are substantially uniform.

23. An exposure apparatus according to claim 11, wherein said wavefront splitting member is disposed in a vicinity of an entrance plane of said light source image forming member.

24. An exposure apparatus according to claim 11, wherein no optical member intervenes between said wavefront splitting member and said light source image forming member.

25. An exposure method comprising the steps of:

causing light which has been split into a plurality of wavefronts to be incident on a light source image forming member from a direction perpendicular to an entrance plane of said light source image forming member and a direction different from said perpendicular direction, so as to increase a number of light source images formed by said light source image forming member;

condensing light beams from said increased number of light source images to illuminate a mask having a pattern, in a superposed manner; and exposing the pattern onto a photosensitive substrate.

26. An exposure method according to claim 25, wherein an aspect ratio of an illumination area on said mask is 1:n (n is an integer more than 1), and the number of said wavefronts of light caused to be incident on said light source image forming member is n.

27. An exposure method according to claim 25, wherein said plurality of wavefronts are constituted by respective diffracted light beams of different order, and intensities of said diffracted light beams are substantially uniform.

28. An exposure method for exposing a pattern on a mask onto a substrate, said method comprising:

disposing a wavefront splitting member, which splits a wavefront of light from a light source into a plurality of wavefronts, on an entrance side of a light source image forming member which forms a plurality of light source images from light that is incident thereon from said light source;

causing a plurality of light beams split by said wavefront splitting member to be incident on said light source image forming member so as to increase a number of the light source images formed by said light source image forming member;

condensing beams from the light source images to illuminate said pattern on the mask; and projecting the image of said pattern onto said substrate.

* * * * *